United States Patent
Dai et al.

(10) Patent No.: US 12,540,124 B2
(45) Date of Patent: *Feb. 3, 2026

(54) COMPOUND, MATERIAL FOR AN ORGANIC ELECTROLUMINESCENT DEVICE AND APPLICATION THEREOF

(71) Applicants: WUHAN TIANMA MICRO-ELECTRONICS CO., LTD., Wuhan (CN); WUHAN TIANMA MICRO-ELECTRONICS CO., LTD. SHANGHAI BRANCH, Shanghai (CN)

(72) Inventors: Wenpeng Dai, Shanghai (CN); Wei Gao, Shanghai (CN); Lei Zhang, Shanghai (CN); Lu Zhai, Shanghai (CN); Xia Li, Shanghai (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 858 days.

This patent is subject to a terminal disclaimer.

(21) Appl. No.: 17/465,705

(22) Filed: Sep. 2, 2021

(65) Prior Publication Data
US 2022/0293861 A1 Sep. 15, 2022

(30) Foreign Application Priority Data
Mar. 1, 2021 (CN) .......................... 202110227698.0

(51) Int. Cl.
*C07D 277/84* (2006.01)
*C07D 263/57* (2006.01)
(Continued)

(52) U.S. Cl.
CPC ......... *C07D 277/84* (2013.01); *C07D 263/57* (2013.01); *H10K 85/633* (2023.02);
(Continued)

(58) Field of Classification Search
CPC .. H10K 85/636; H10K 85/631; H10K 85/633; H10K 85/6565; C07D 263/57;
(Continued)

(56) References Cited

U.S. PATENT DOCUMENTS

2020/0258946 A1* 8/2020 Kim ...................... H10K 50/115
2021/0210684 A1* 7/2021 Lee ...................... H10K 85/615
(Continued)

FOREIGN PATENT DOCUMENTS

| CN | 108774175 A | * 11/2018 | ........... C07D 235/18 |
|----|-------------|-----------|----------------------|
| CN | 109824659 A | 5/2019 | |
| CN | 110964002 A | 12/2019 | |

OTHER PUBLICATIONS

Machine Translation of CN108774175A (Year: 2018).*

*Primary Examiner* — Jenna N Chandhok
(74) *Attorney, Agent, or Firm* — ALSTON & BIRD LLP

(57) ABSTRACT

The present disclosure relates to a compound, a material for an organic electroluminescent device and an application thereof. The compound has a structure represented by Formula (1). The compound has a relatively high refractive index in the region of visible light (400-750 nm), which is conducive to improving the light-emitting efficiency.

15 Claims, 1 Drawing Sheet

(51) Int. Cl.
*H10K 50/858* (2023.01)
*H10K 59/80* (2023.01)
*H10K 85/60* (2023.01)

(52) U.S. Cl.
CPC ......... *H10K 85/636* (2023.02); *H10K 59/879* (2023.02); *H10K 85/615* (2023.02); *H10K 85/626* (2023.02); *H10K 85/657* (2023.02)

(58) Field of Classification Search
CPC .. C07D 277/84; C07D 251/24; C07D 263/64; C07D 271/10; C07D 277/66; C07D 417/12; C07D 413/10; C07D 413/12; C07D 413/14; C07D 417/10; C07D 417/14; C07D 471/04; C07D 487/14; C07D 498/04; C07D 513/04; C07D 519/00
See application file for complete search history.

(56) References Cited

U.S. PATENT DOCUMENTS

| | | | |
|---|---|---|---|
| 2022/0119360 A1* | 4/2022 | Mochizuki | H10K 85/346 |
| 2022/0281870 A1* | 9/2022 | Dai | C07D 285/12 |

* cited by examiner

COMPOUND, MATERIAL FOR AN ORGANIC ELECTROLUMINESCENT DEVICE AND APPLICATION THEREOF

CROSS-REFERENCE TO RELATED APPLICATION(S)

This application claims priority to Chinese Patent Application No. 202110227698.0 filed on Mar. 1, 2021, the disclosure of which is incorporated herein by reference in its entirety.

TECHNICAL FIELD

The present disclosure relates to the technical field of organic electroluminescence and in particular, to a compound, a material for an organic electroluminescent device and an application thereof.

BACKGROUND

After decades of development, organic electroluminescence (such as organic light-emitting diode, OLED) has gained considerable progress. The OLED has an internal quantum efficiency of approximately 100% and an external quantum efficiency of only about 20%. Most light is confined inside a light-emitting device due to factors such as a loss of a substrate mode, a surface plasmon loss and a waveguide effect, resulting in a loss of a large amount of energy.

In a top emitting device, an organic capping layer (CPL) is deposited through evaporation on a translucent metal electrode A1 so that an optical interference distance is adjusted, the reflection of external light is suppressed, and the extinction caused by the movement of surface plasmon is suppressed, thereby improving light extraction efficiency and light-emitting efficiency.

High requirements are imposed on the performance of a material for CPL: no absorption within the wavelength range (400 nm to 700 nm) of visible light, a high refractive index (generally, n>2.1), a low extinction coefficient (k≤0.00) within the wavelength range of 400 nm to 600 nm, a high glass transition temperature, a high molecular thermal stability, and an ability to be deposited through evaporation without thermal decomposition.

Materials for CPL in the related art still have many problems, for example, (1) the refractive index is generally below 1.9 and cannot meet the requirement for high refractive index; (2) in the case where the refractive index meets the requirement, the materials have relatively strong absorption or a relatively large extinction coefficient in the region of visible light; (3) amine derivatives with a particular structure and a high refractive index and the use of materials that have particular parameters have improved the light extraction efficiency, while the problems of light-emitting efficiency and chromaticity are still to be solved especially for blue light-emitting elements; (4) to increase the density of molecules and achieve high thermal stability, a molecular structure is designed to be large and loose so that molecules cannot be tightly packed, resulting in too many molecular gel holes during evaporation and incomplete coverage; (5) a simple design of an electron-type capping layer material to achieve the effects of electron transmission and light extraction saves a preparation cost of the device to a certain extent so that multiple effects are achieved, while the design is not conducive to light extraction and improves the light-emitting efficiency only slightly and the problem of chromaticity is not solved.

Therefore, more kinds of CPL materials with higher performance are to be developed in the art.

SUMMARY

In view of defects in the related art, a first object of the present disclosure is to provide a compound, in particular, a material for a capping layer. The compound has a relatively high refractive index in the region of visible light (400-750 nm), which is beneficial for improving the light-emitting efficiency. Meanwhile, the compound has a relatively large extinction coefficient in the ultraviolet region (less than 400 nm), which is beneficial for absorbing harmful light and protecting eyesight.

To achieve the object, the present disclosure adopts a technical solution described below.

The present disclosure provides a compound, which has a structure represented by Formula (1):

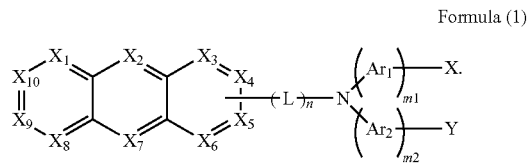

Formula (1)

In Formula (1), $X_1$ to $X_{10}$ are each independently selected from N, CH and CRa, where Ra is selected from any one or a combination of at least two of a deuterium atom, $CD_3$, $CD_2CH_3$, $CD_2CD_3$, cyano and substituted or unsubstituted C6-C60 aryl.

In Formula (1), n is an integer from 0 to 4, and L is selected from substituted or unsubstituted C6-C60 arylene and substituted or unsubstituted C3-C60 heteroarylene.

In Formula (1), m1 and m2 are each independently an integer from 0 to 4, and $Ar_1$ and $Ar_2$ are each independently selected from substituted or unsubstituted C6-C60 arylene and substituted or unsubstituted C3-C60 heteroarylene.

In Formula (1), X and Y are each independently selected from substituted or unsubstituted C6-C60 aryl and substituted or unsubstituted C3-C60 heteroaryl, and at least one of X and Y is selected from substituted or unsubstituted C3-C60 electron withdrawing heteroaryl.

Substituted groups in Ra, L, $Ar_1$, $Ar_2$, X and Y are each independently selected from any one or a combination of at least two of protium, deuterium, tritium, cyano, halogen, C1-C10 alkyl, C1-C10 haloalkyl, C1-C10 alkoxy, C6-C60 aryl and C3-C60 heteroaryl.

A second object of the present disclosure is to provide a material for an organic electroluminescent device. The material for an organic electroluminescent device includes any one or a combination of at least two of the compound as described for the first object.

A third object of the present disclosure is to provide an organic electroluminescent device. The organic electroluminescent device includes a first electrode layer, an organic function layer and a second electrode layer which are stacked in sequence.

The organic function layer includes the material as described for the second object.

A fourth object of the present disclosure is to provide an organic electroluminescent device. The organic electroluminescent device includes a first capping layer, a first electrode layer, an organic function layer and a second electrode layer which are stacked in sequence.

The first capping layer includes the material as described for the second object.

A fifth object of the present disclosure is to provide a display panel. The display panel includes the organic electroluminescent device as described for the third object or the fourth object.

A sixth object of the present disclosure is to provide a display device. The display device includes the display panel as described for the fifth object.

Compared with the related art, the present disclosure has beneficial effects described below.

(1) The compound provided by the present disclosure has a relatively high refractive index in the region of visible light (400-750 nm) and can effectively improve the light extraction efficiency and the external quantum efficiency (EQE) of an organic electroluminescent device when used in the organic electroluminescent device especially as a material for the capping layer.

(2) The compound of the present disclosure has a relatively large extinction coefficient in the ultraviolet region (less than 400 nm), which is beneficial for absorbing harmful light and protecting eyesight.

(3) The compound of the present disclosure has a relatively small extinction coefficient in the region of blue light (400-450 nm) and hardly absorbs blue light, which is beneficial for improving the light-emitting efficiency.

Figure 1:
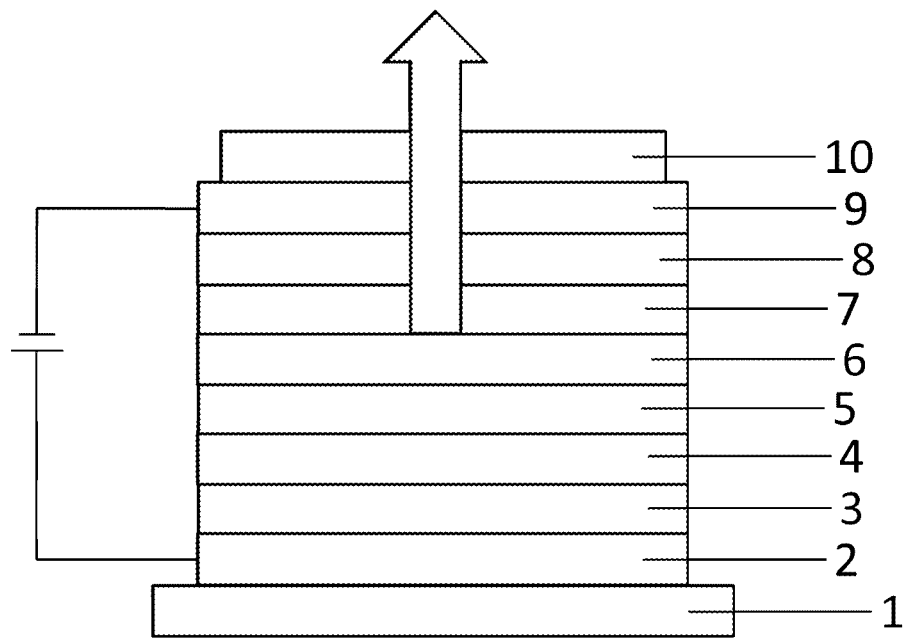
FIG. 1 is a structure diagram of an organic electroluminescent device according to an embodiment of the present disclosure.

REFERENCE LIST 1 substrate
2 anode
3 hole injection layer
4 first hole transport layer
5 second hole transport layer
6 light-emitting layer
7 first electron transport layer
8 second electron transport layer
9 cathode
10 first capping layer
11 second capping layer

DETAILED DESCRIPTION

In accordance with one embodiment of present disclosure, a compound is provided.

The compound has a structure represented by Formula (1):

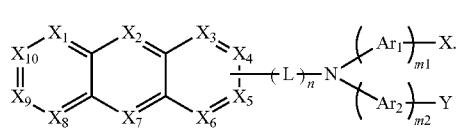

Formula (1)

In Formula (1), $X_1$ to $X_{10}$ are each independently selected from N, CH and CRa, where Ra is selected from any one or a combination of at least two of a deuterium atom, $CD_3$, $CD_2CH_3$, $CD_2CD_3$, cyano and substituted or unsubstituted C6-C60 (for example, C8, C10, C12, C14, C16, C18, C20, C22, C24, C26, C28, C30, C32, C34, C36, C38, C40, C42, C44, C46, C48, C50, C52, C54, C56, C58 or the like) aryl.

In Formula (1), n is an integer from 0 to 4 (for example, 1, 2, 3 or the like), and L is selected from substituted or unsubstituted C6-C60 (for example, C8, C10, C12, C14, C16, C18, C20, C22, C24, C26, C28, C30, C32, C34, C36, C38, C40, C42, C44, C46, C48, C50, C52, C54, C56, C58 or the like) arylene and substituted or unsubstituted C3-C60 (for example, C4, C5, C6, C7, C8, C10, C12, C14, C16, C18, C20, C22, C24, C26, C28, C30, C32, C34, C36, C38, C40, C42, C44, C46, C48, C50, C52, C54, C56, C58 or the like) heteroarylene.

In Formula (1), m1 and m2 are each independently an integer from 0 to 4 (for example, 1, 2, 3 or the like), and $Ar_1$ and $Ar_2$ are each independently selected from substituted or unsubstituted C6-C60 (for example, C8, C10, C12, C14, C16, C18, C20, C22, C24, C26, C28, C30, C32, C34, C36, C38, C40, C42, C44, C46, C48, C50, C52, C54, C56, C58 or the like) arylene and substituted or unsubstituted C3-C60 (for example, C4, C5, C6, C7, C8, C10, C12, C14, C16, C18, C20, C22, C24, C26, C28, C30, C32, C34, C36, C38, C40, C42, C44, C46, C48, C50, C52, C54, C56, C58 or the like) heteroarylene.

In Formula (1), X and Y are each independently selected from substituted or unsubstituted C6-C60 (for example, C8, C10, C12, C14, C16, C18, C20, C22, C24, C26, C28, C30, C32, C34, C36, C38, C40, C42, C44, C46, C48, C50, C52, C54, C56, C58 or the like) aryl and substituted or unsubstituted C3-C60 (for example, C4, C5, C6, C7, C8, C10, C12, C14, C16, C18, C20, C22, C24, C26, C28, C30, C32, C34, C36, C38, C40, C42, C44, C46, C48, C50, C52, C54, C56, C58 or the like) heteroaryl, and at least one of X and Y is selected from substituted or unsubstituted C3-C60 (for example, C4, C5, C6, C7, C8, C10, C12, C14, C16, C18, C20, C22, C24, C26, C28, C30, C32, C34, C36, C38, C40, C42, C44, C46, C48, C50, C52, C54, C56, C58 or the like) electron withdrawing heteroaryl.

Substituted groups in Ra, L, $Ar_1$, $Ar_2$, X and Y are each independently selected from any one or a combination of at least two of protium, deuterium, tritium, cyano, halogen, C1-C10 (for example, C2, C3, C4, C5, C6, C7, C8, C9 or the like) alkyl, C1-C10 (for example, C2, C3, C4, C5, C6, C7, C8, C9 or the like) haloalkyl, C1-C10 (for example, C2, C3, C4, C5, C6, C7, C8, C9 or the like) alkoxy, C6-C60 (for example, C8, C10, C12, C14, C16, C18, C20, C22, C24, C26, C28, C30, C32, C34, C36, C38, C40, C42, C44, C46, C48, C50, C52, C54, C56, C58 or the like) aryl and C3-C60 (for example, C4, C5, C6, C7, C8, C10, C12, C14, C16, C18, C20, C22, C24, C26, C28, C30, C32, C34, C36, C38, C40, C42, C44, C46, C48, C50, C52, C54, C56, C58 or the like) heteroaryl.

The introduction of an arylamino group into an anthryl group increases a conjugation area of a molecule and the linkage of at least one electron withdrawing heteroaryl group to an amino group of the arylamino group improves the polarity of the molecule so that the compound has a relatively high refractive index in the region of visible light (400-750 nm) and can effectively improve the light extraction efficiency and the external quantum efficiency (EQE) of an organic optoelectronic device when used in the organic electroluminescent device especially as a material for the capping layer.

Moreover, the compound of the present disclosure has a relatively large extinction coefficient in the ultraviolet region (less than 400 nm), which is beneficial for absorbing harmful light and protecting eyesight.

In addition, the compound of the present disclosure has a relatively small extinction coefficient in the region of blue light (400-450 nm) and hardly absorbs blue light, which is beneficial for improving the light-emitting efficiency.

In an embodiment, the compound has a structure represented by Formula (2):

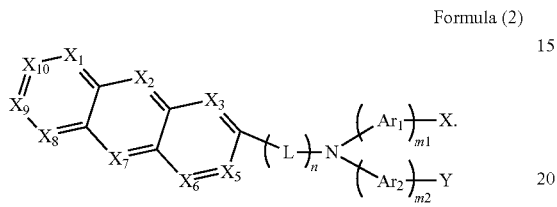

Formula (2)

In Formula (2), $X_1$ to $X_{10}$, n, m1, m2, X and Y each have the same ranges as defined in Formula (1).

In an embodiment of the present disclosure, L is linked to position 2 of the anthryl group, and the compound formed through such linkage at this position has the longest conjugation area, which can further improve the molecular planarity, improve the molecular coating arrangement, and improve the light extraction efficiency.

In an embodiment, $X_1$, $X_2$, $X_3$, $X_4$, $X_5$, $X_6$, $X_7$, $X_8$, $X_9$ and $X_{10}$ are each CH.

In the present disclosure, further preferably, all the preceding positions are all C atoms and have no substituents. This structure is chemically stable so that the lifetime of the device can be further improved.

In an embodiment, at least one of $X_1$, $X_2$, $X_3$, $X_4$, $X_5$, $X_6$, $X_7$, $X_8$, $X_9$ and $X_{10}$ is selected from N.

In the present disclosure, further preferably, the preceding positions contain at least one N. This structure improves the polarity of the molecule so that the light-emitting efficiency of the device can be further improved.

In an embodiment, at least one of $X_1$, $X_2$, $X_3$, $X_4$, $X_5$, $X_6$, $X_7$, $X_8$, $X_9$ and $X_{10}$ is selected from CD.

When an anthracene ring is substituted with at least one deuterium atom, the compound has more stable chemical properties, thereby obtaining a longer device lifetime.

In an embodiment, $X_2$ and $X_7$ are each selected from CD.

Further, a better effect is achieved when the preceding two positions are substituted with deuterium atoms. This is because hydrogen at the positions of $X_2$ and $X_7$ is the most active and when these two positions are deuterated, the resulting compound does not easily break down at a high temperature.

In an embodiment, X and Y are each independently selected from substituted or unsubstituted C3-C60 electron withdrawing heteroaryl.

In the present disclosure, in one embodiment, X and Y are both electron withdrawing heteroaryl groups so that the compound has the strongest polarity, thereby further increasing the refractive index of the molecule.

In an embodiment, the C3-C60 electron withdrawing heteroaryl is selected from any one of the following groups:

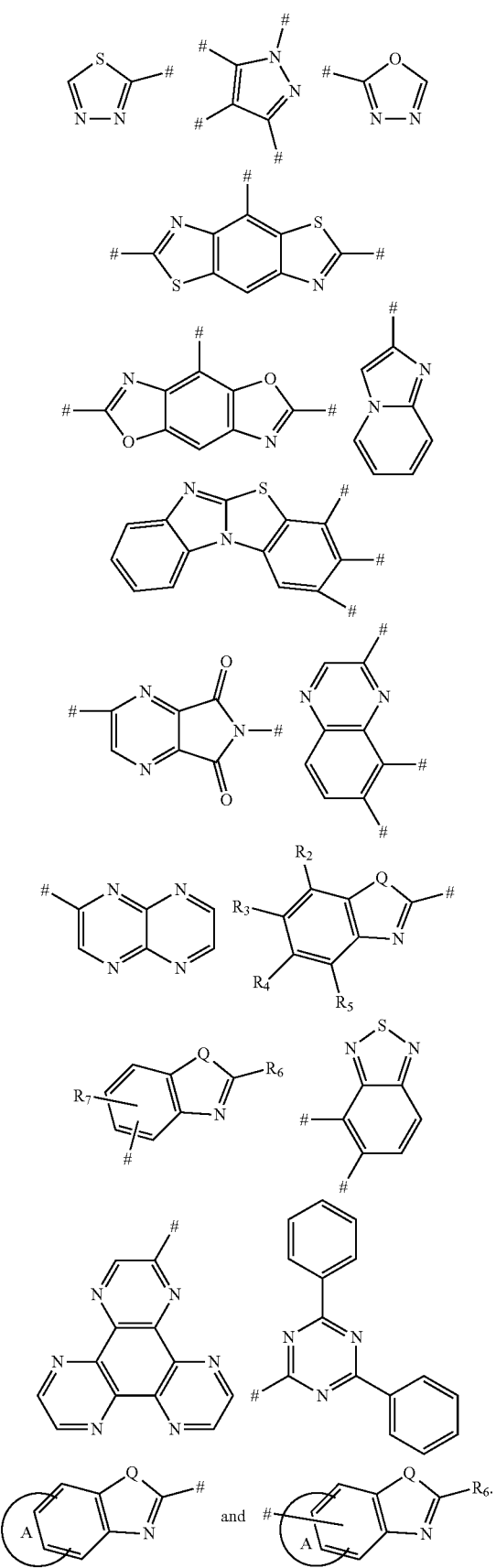

\# represents a linkage site of the group.

Q is selected from an O atom, a S atom and NR$_8$.

R$_2$ to R$_7$ are each independently selected from any one of hydrogen, protium, deuterium, tritium, halogen, cyano, C1-C10 alkyl, C1-C10 alkoxy, C6-C60 aryl and C3-C60 heteroaryl.

The ring A is fused at any position of a benzene ring where the ring A can be fused and the ring A is selected from substituted or unsubstituted C6-C30 aromatic rings and substituted or unsubstituted C3-C30 heteroaromatic rings.

In an embodiment, the C3-C60 electron withdrawing heteroaryl is selected from any one of the following groups:

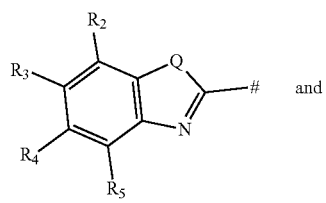

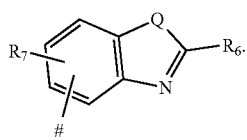

\# represents a linkage site of the group.

Q and R$_2$ to R$_7$ each have the same selection ranges as the above.

In an embodiment, the C3-C60 electron withdrawing heteroaryl is selected from any one of the following groups:

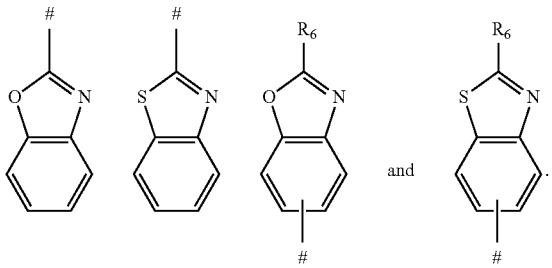

\# represents a linkage site of the group.

R$_6$ has the same selection range as the above.

In an embodiment, L, Ar$_1$ and Ar$_2$ are each independently selected from any one of the following substituted or unsubstituted groups: phenylene, biphenylene, terphenylene, tetraphenylene, naphthylene, phenanthrylene, fluorenylidene, carbazolylene, dibenzofurylene, dibenzothienylene, pyrimidinylene, triazinylene, indolocarbazolylene, indolobenzofurylene, indolobenzothienylene, benzofuropyrimidinylene, benzothienopyrimidinylene, anthrylene and pyrenylene.

In an embodiment, the difference between the refractive index of the compound at a wavelength of 460 nm and the refractive index of the compound at a wavelength of 530 nm is 0.10-0.17 (for example, 0.11, 0.12, 0.13, 0.14, 0.16 or the like), the difference between the refractive index of the compound at a wavelength of 530 nm and the refractive index of the compound at a wavelength of 620 nm is 0.03-0.10 (for example, 0.04, 0.05, 0.06, 0.07, 0.08, 0.09 or the like), and the difference between the refractive index of the compound at a wavelength of 460 nm and the refractive index of the compound at a wavelength of 620 nm is 0.15-0.40 (for example, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39 or the like).

In an embodiment, a film with a thickness of 700 angstroms and prepared from the compound has an absorbance greater than 0.3 at a wavelength of 250 nm and at a wavelength of 380 nm, for example, 0.4, 0.5, 0.6, 0.7, 0.8, 0.9 or the like.

In an embodiment, the compound has any one of structures represented by P1 to P123:

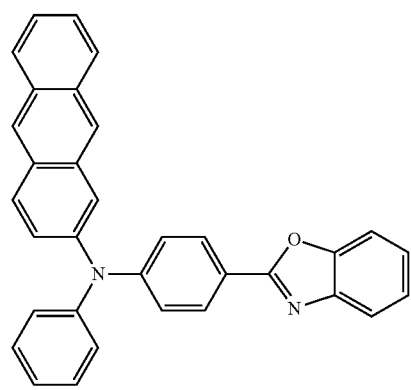

P1

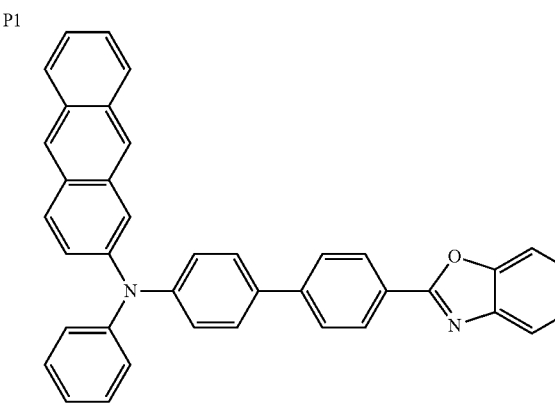

P2

-continued
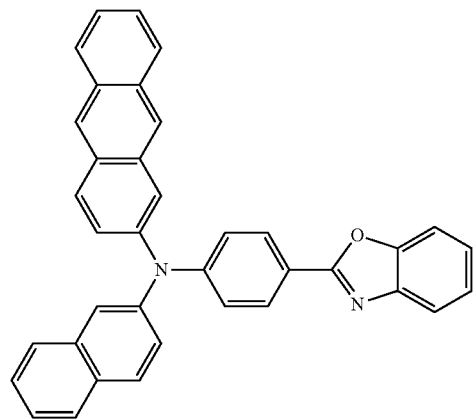
P3
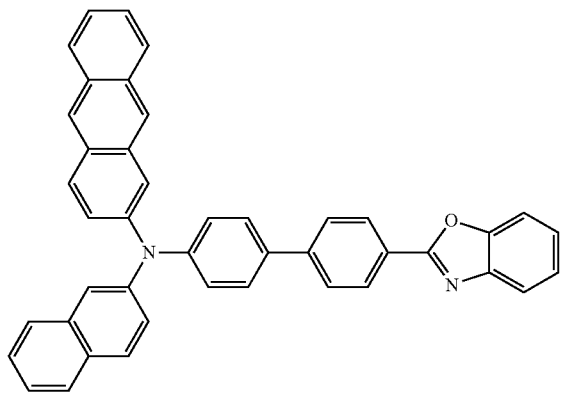
P4
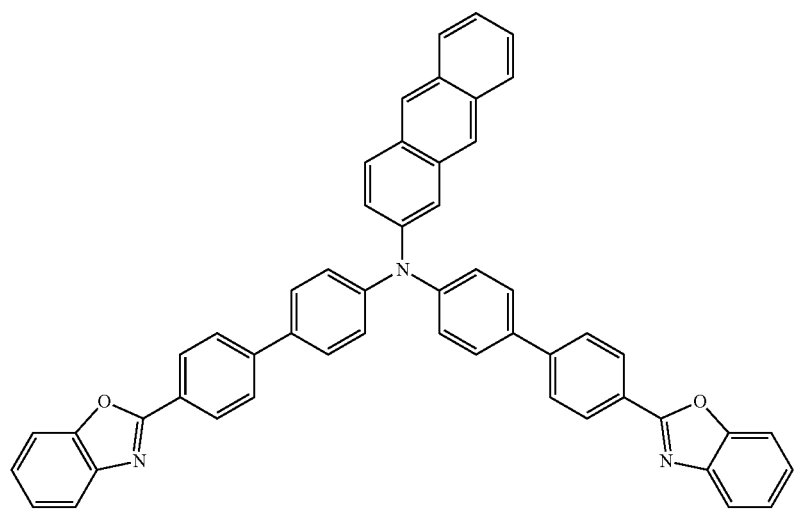
P5
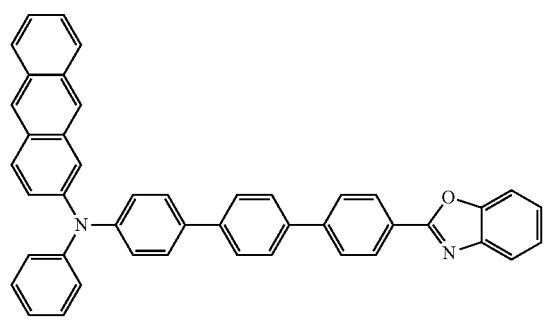
P6
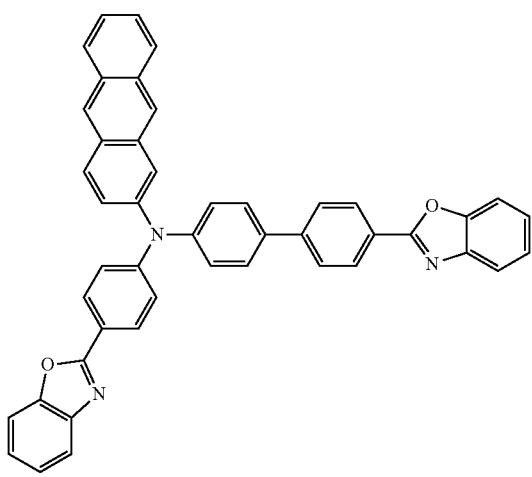
P7

-continued
P8
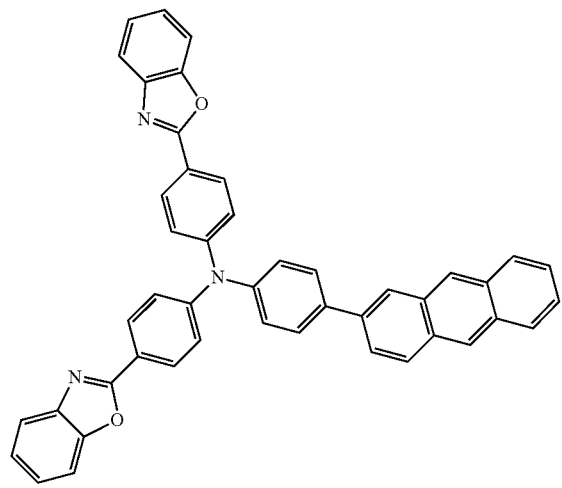
P9
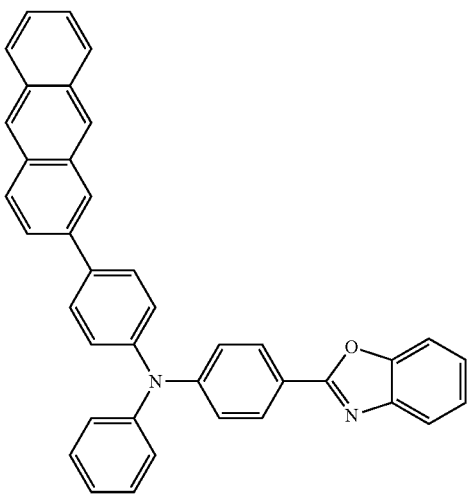
P10
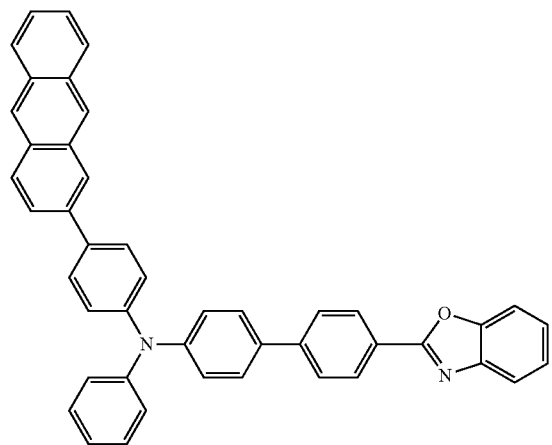
P11
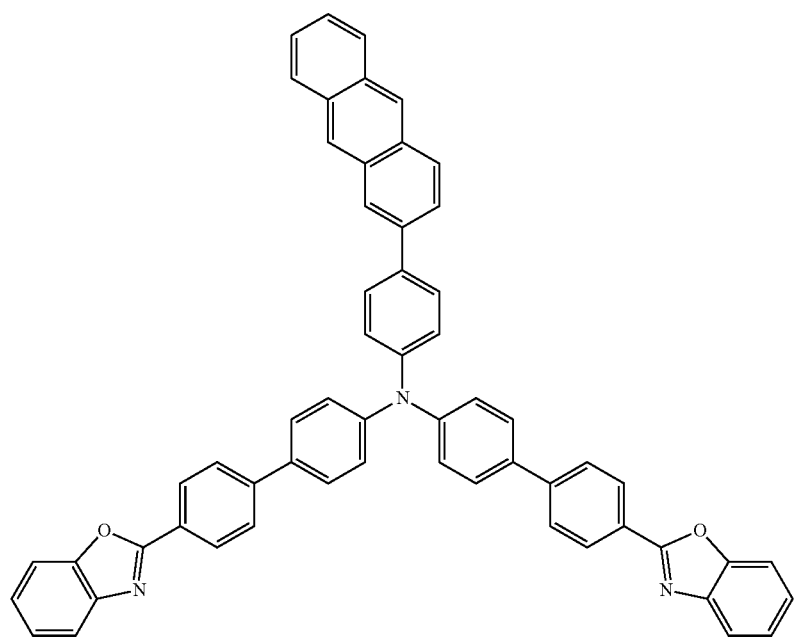

-continued
P12
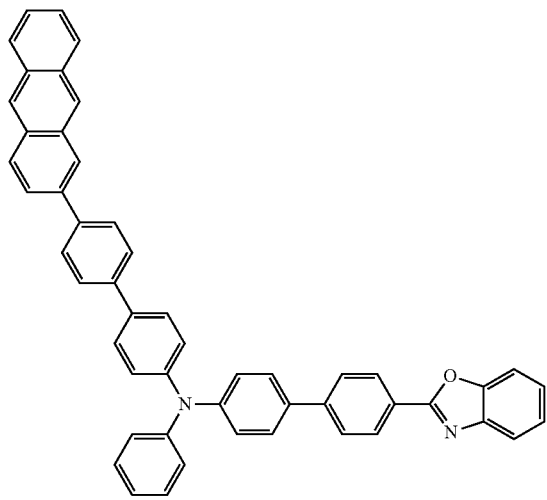
P13
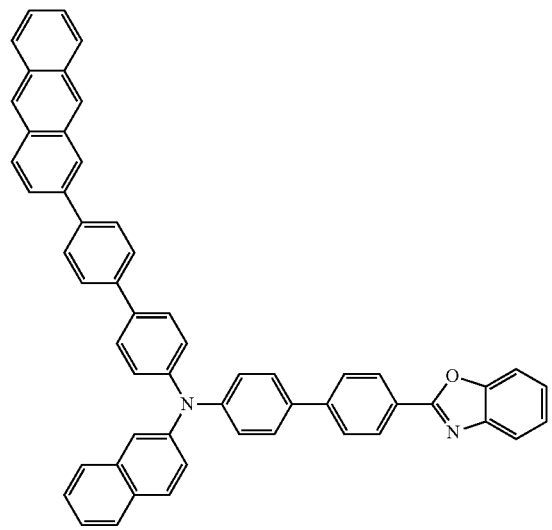
P14
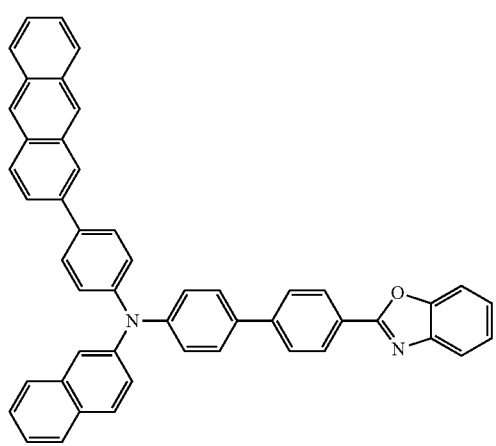
P15
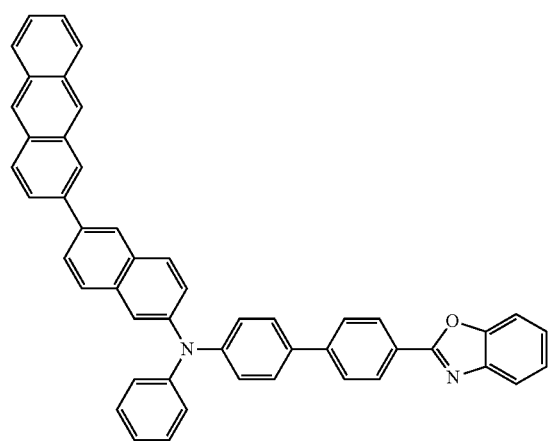
P16
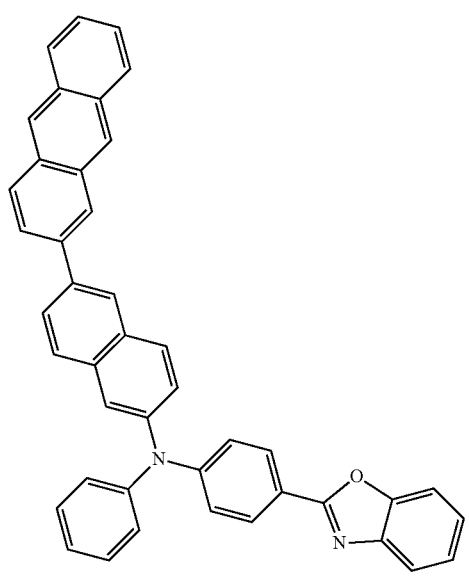
P17
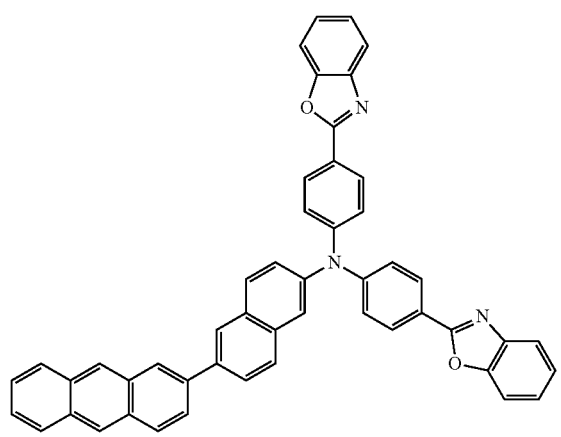

-continued
P18
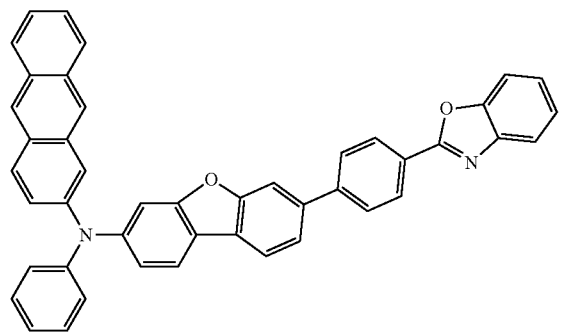
P19
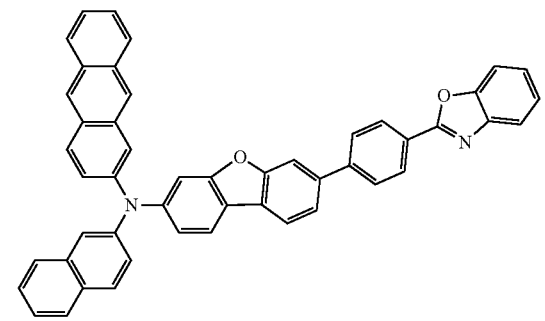
P20
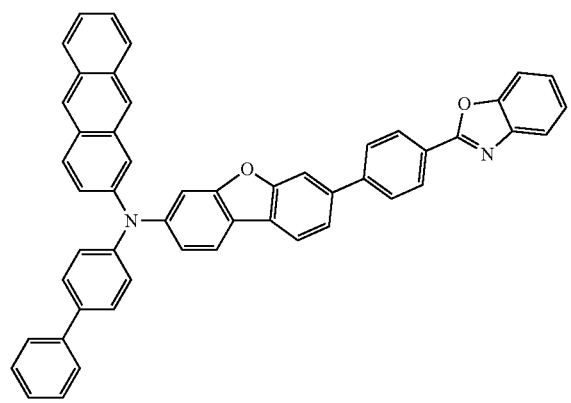
P21
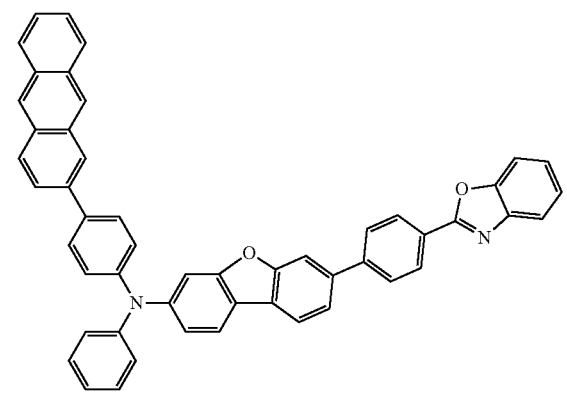
P22
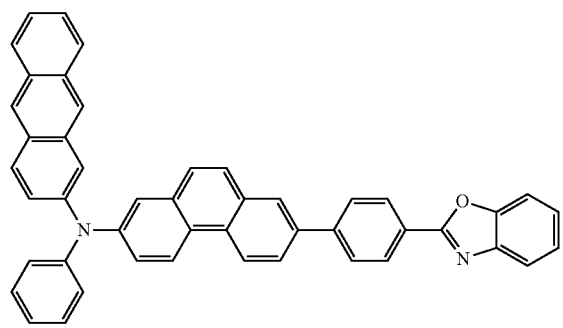
P23
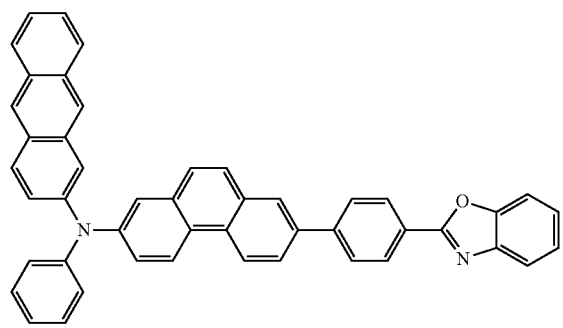
P24
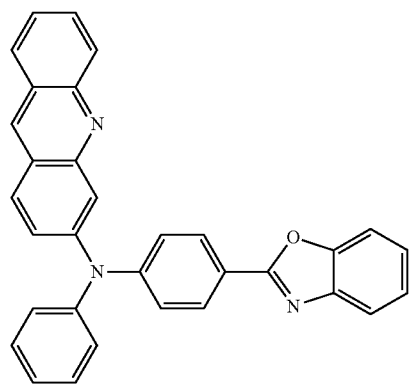
P25
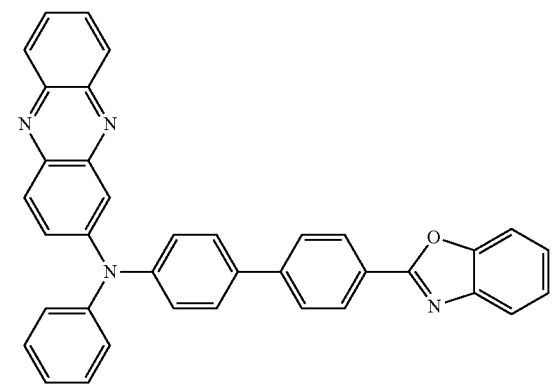

-continued
P26
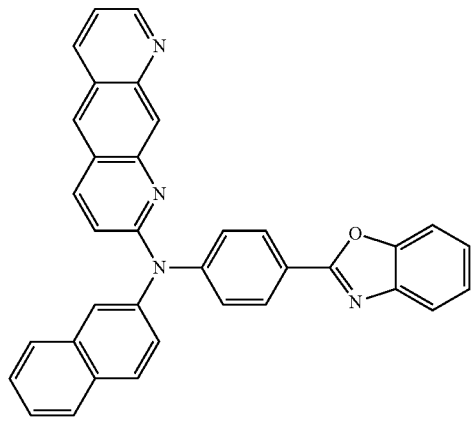
P27
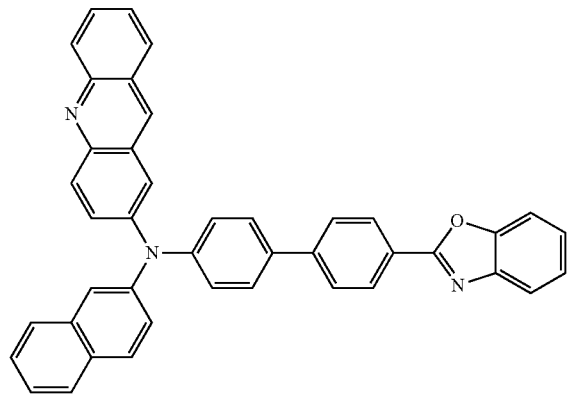
P28
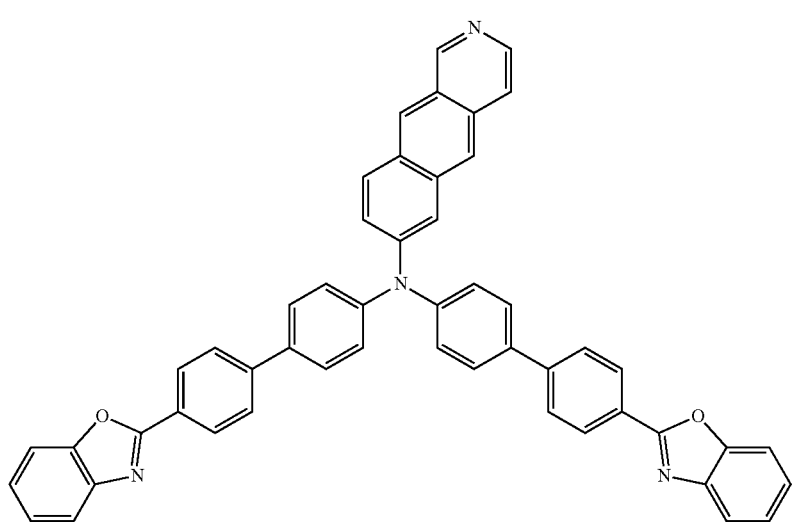
P29
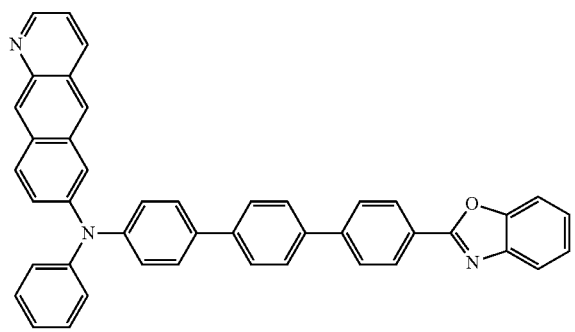
P30
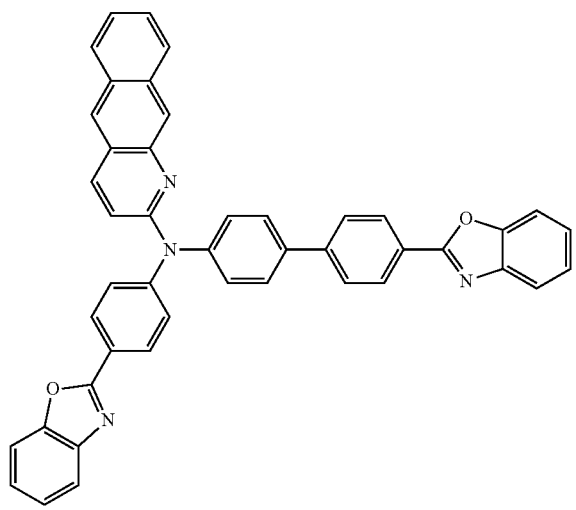

-continued
P31
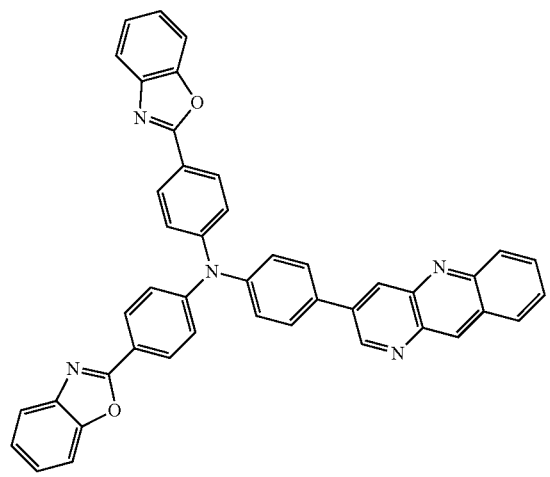
P32
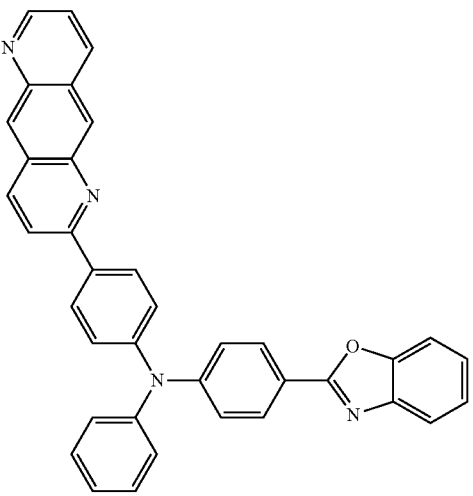
P33
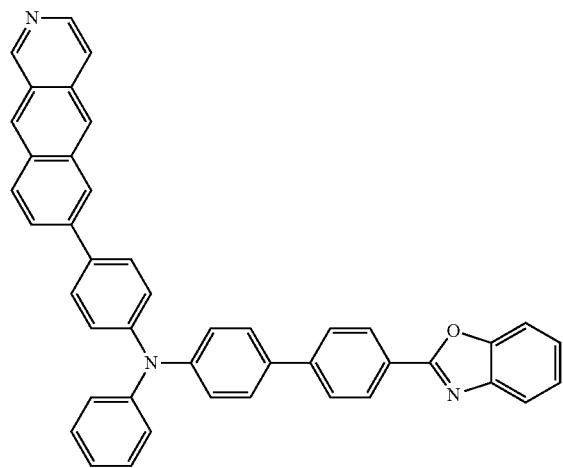
P34
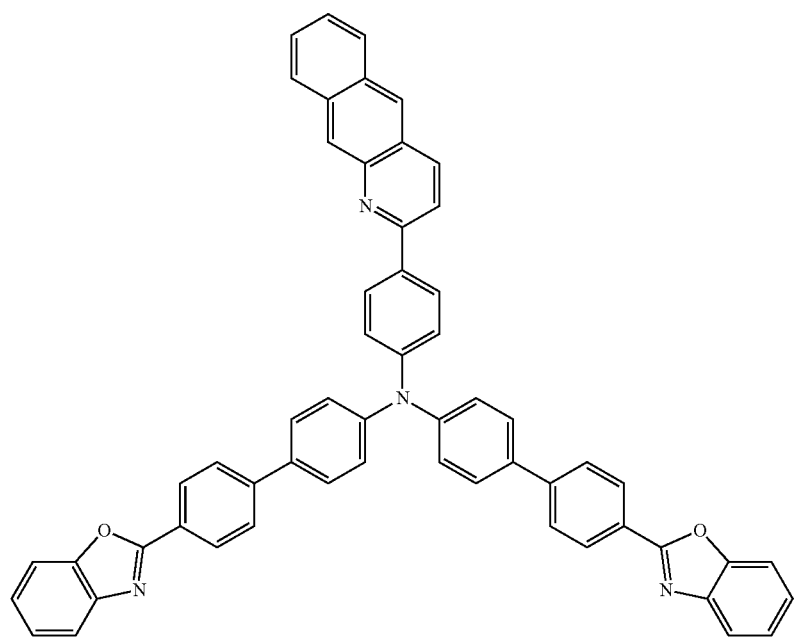

-continued
P35
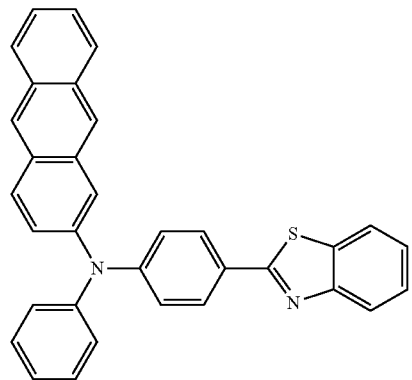
P36
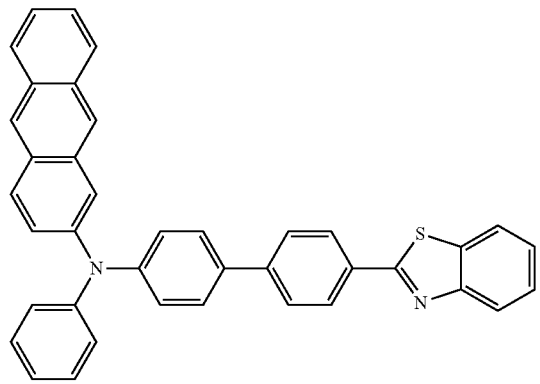
P37
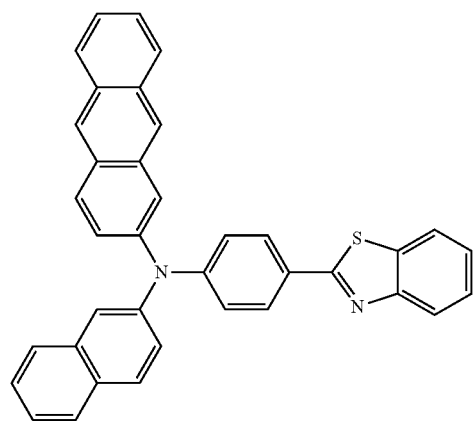
P38
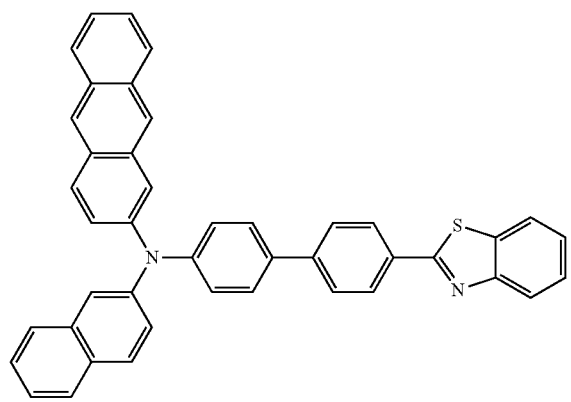
P39
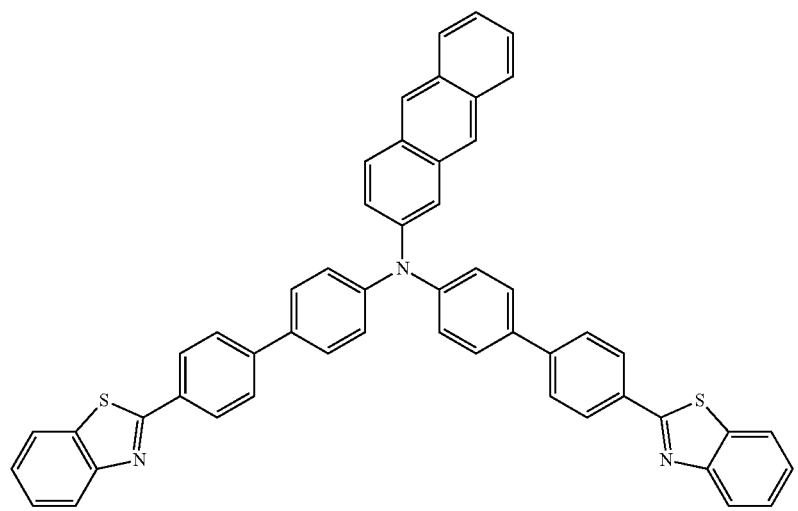

P40
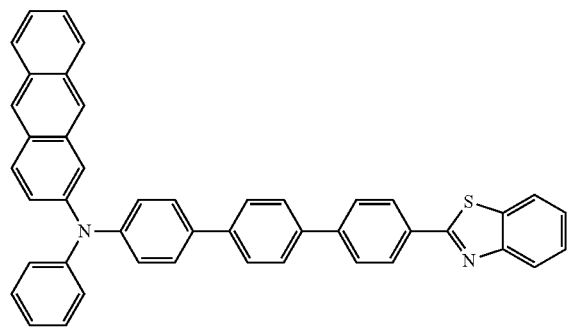
P41
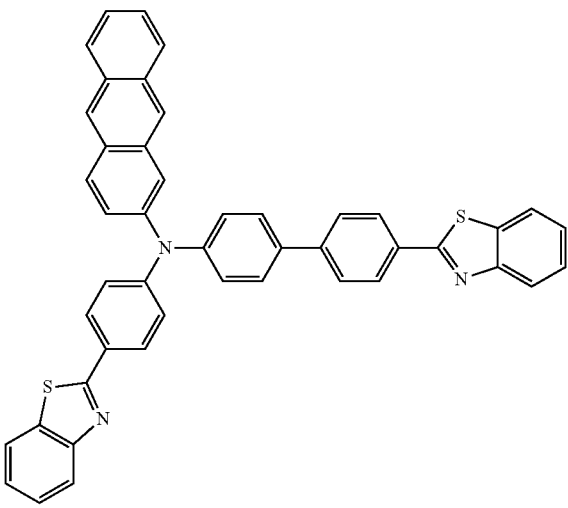
P42
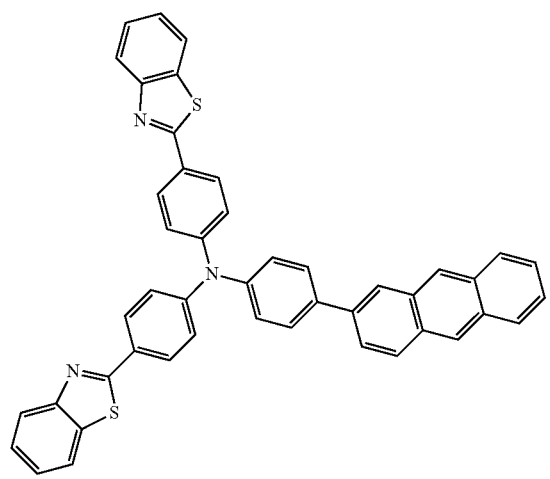
P43
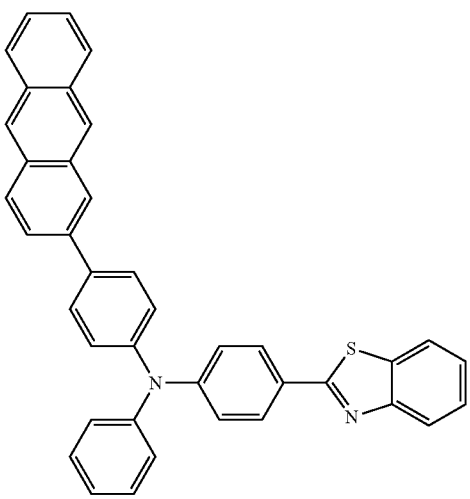
P44
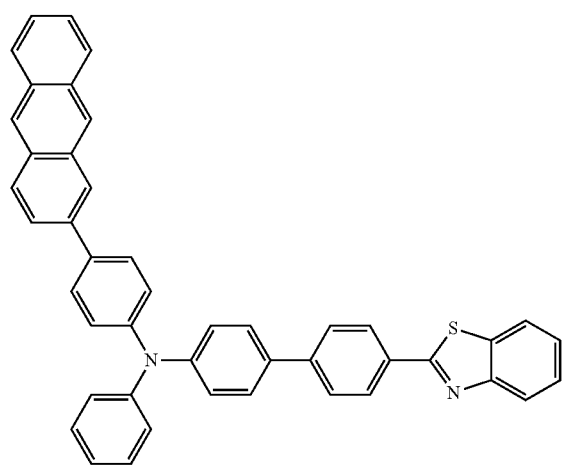

-continued
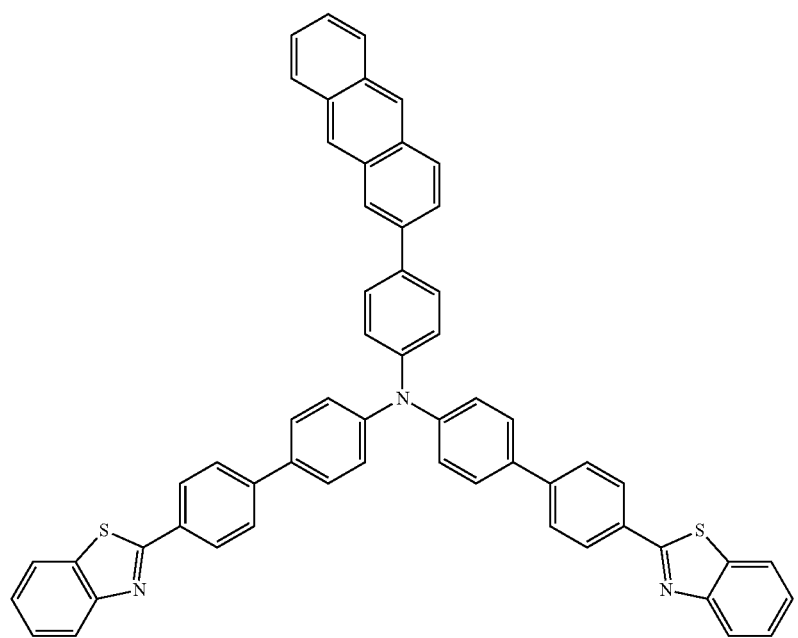
P45
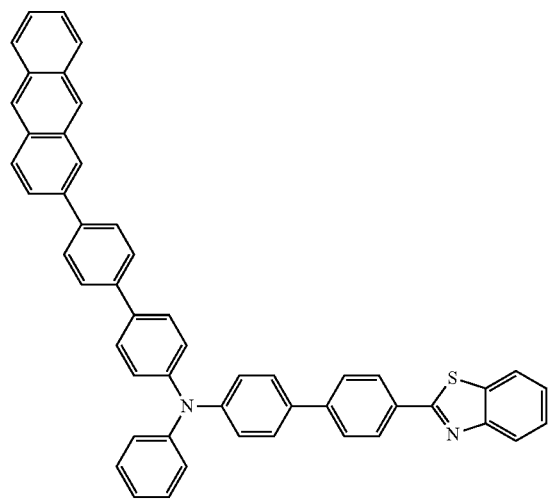
P46
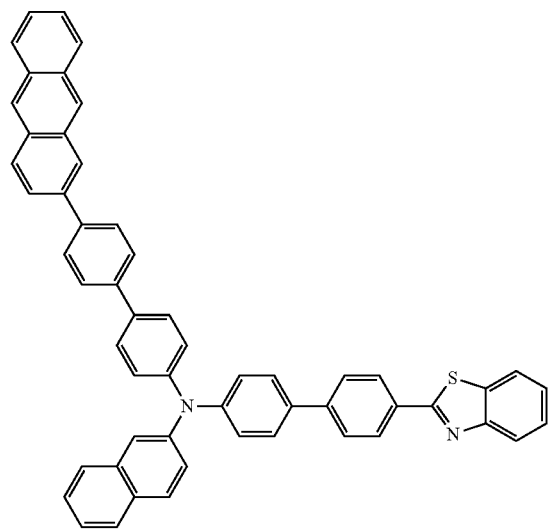
P47
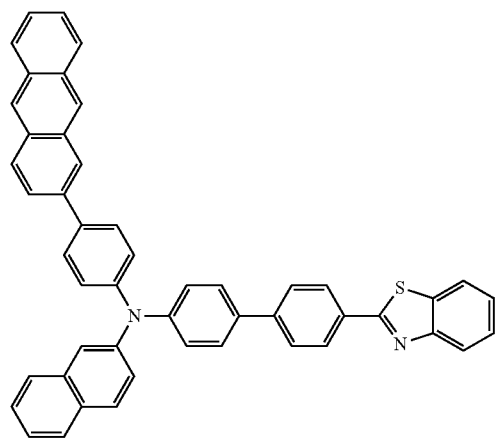
P48
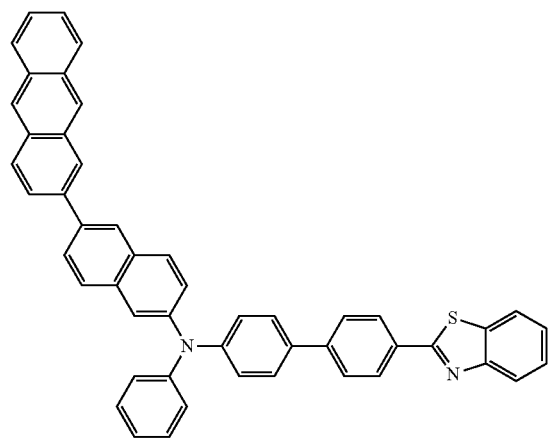
P49

-continued
P50
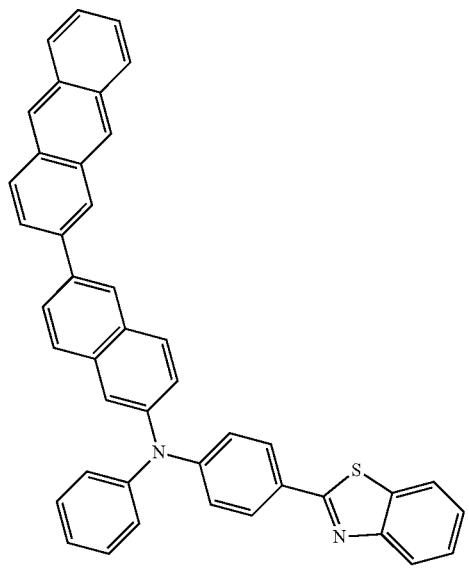
P51
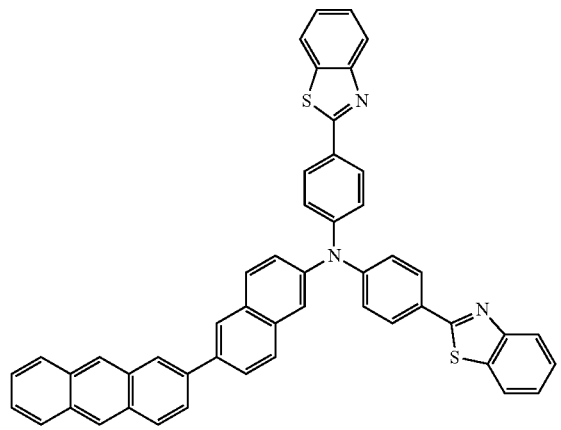
P52
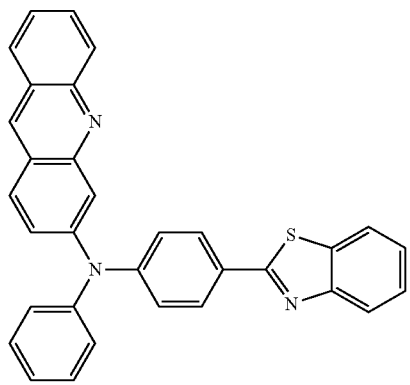
P53
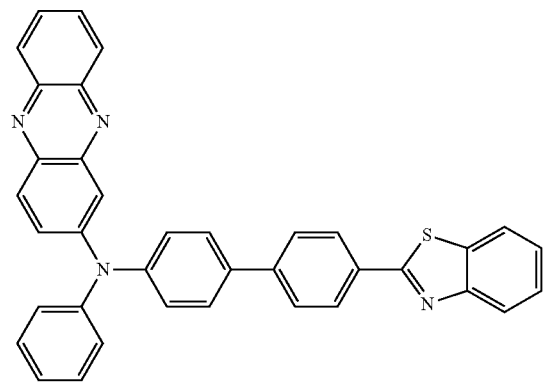
P54
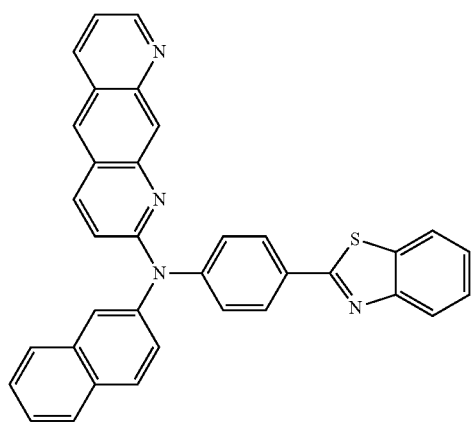
P55
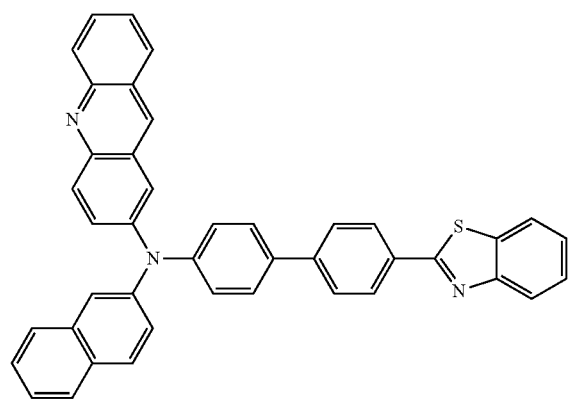

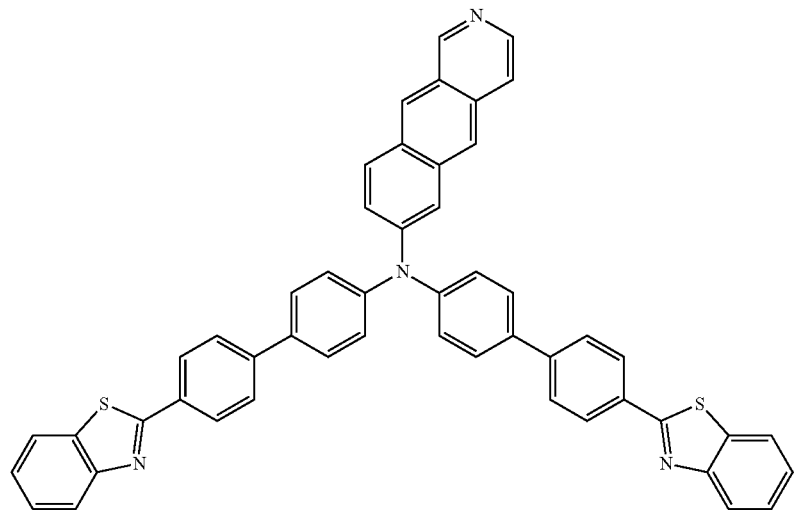
P56
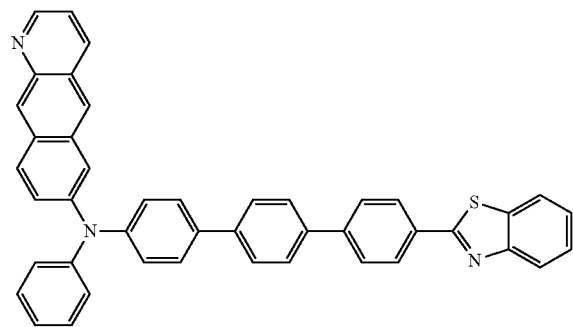
P57
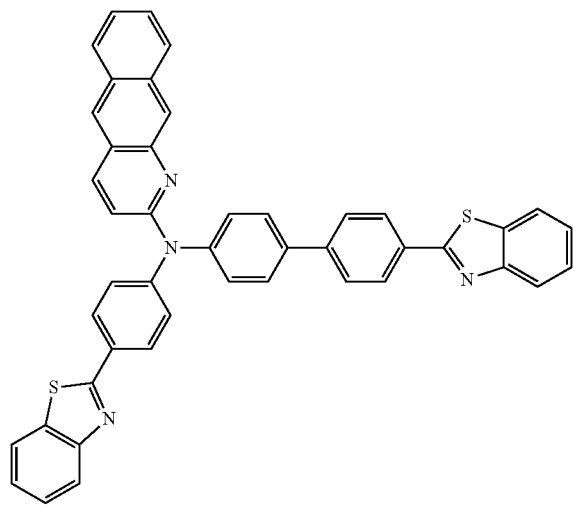
P58
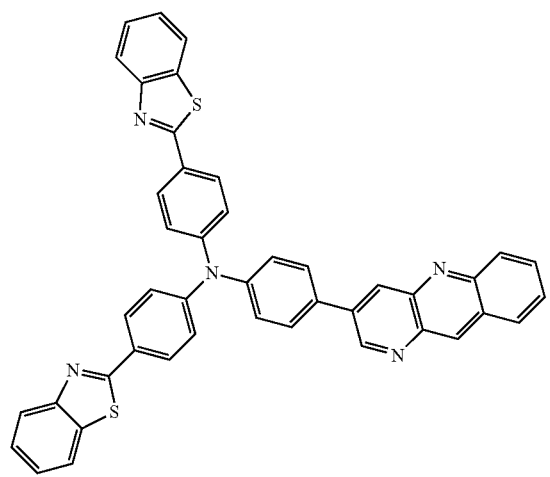
P59
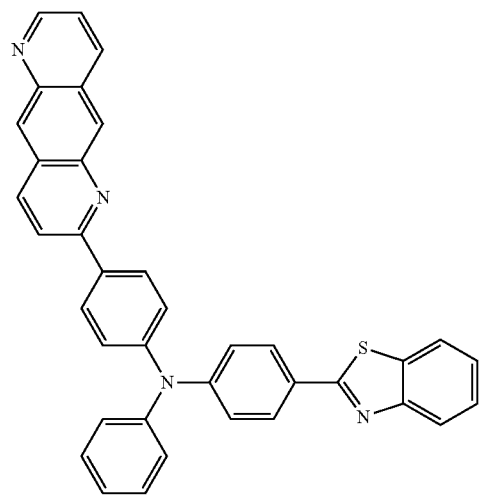
P60

-continued
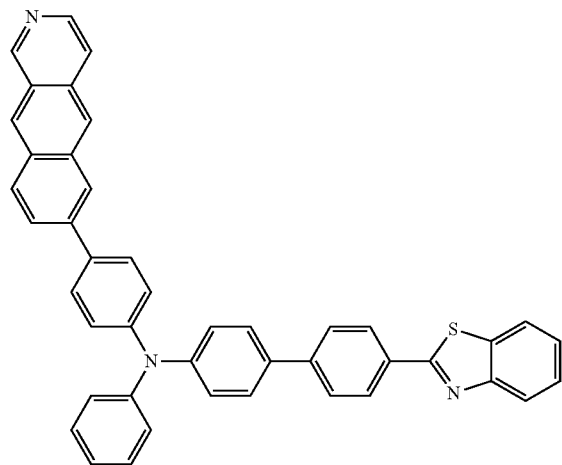
P61
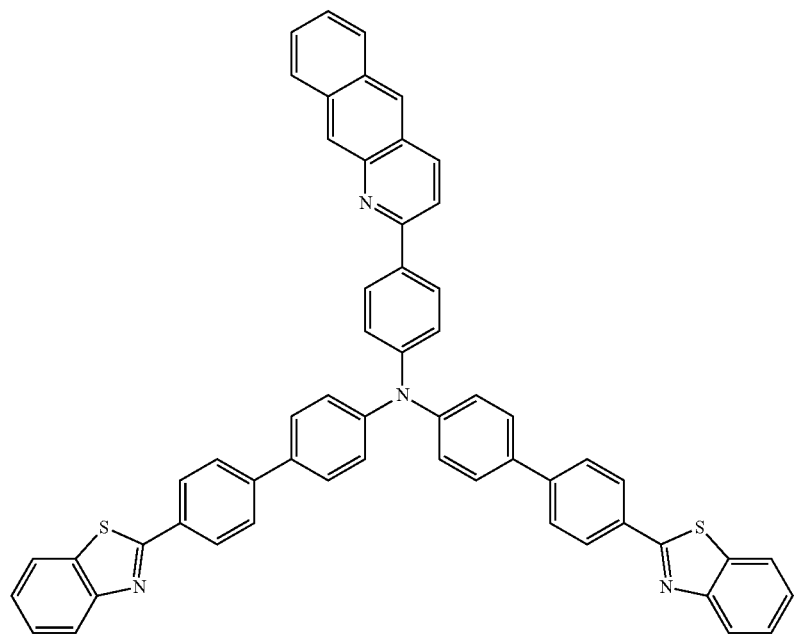
P62
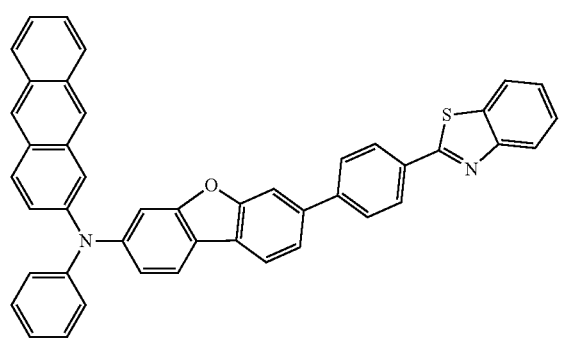
P63
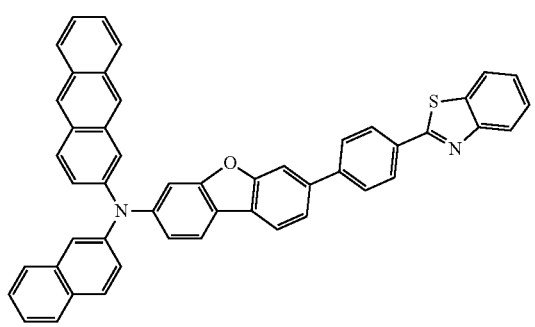
P64

-continued
P65
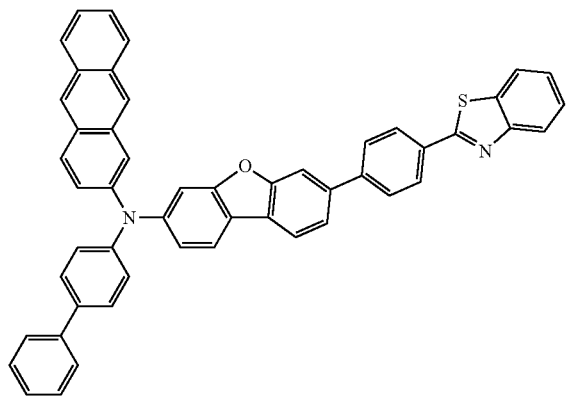
P66
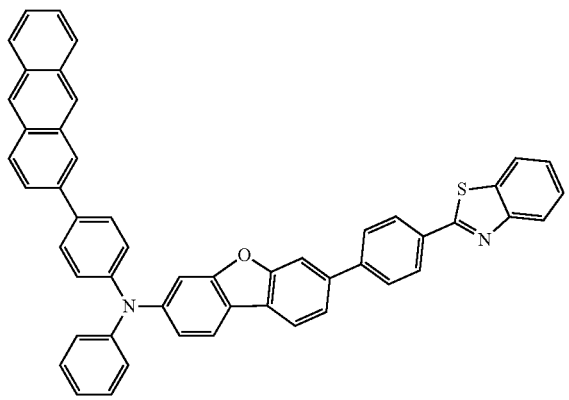
P67
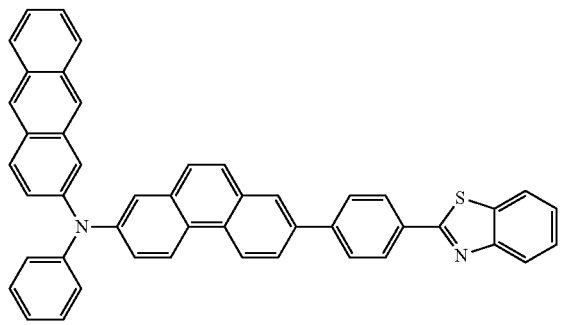
P68
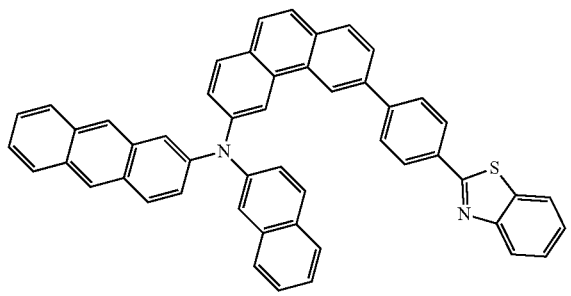
P69
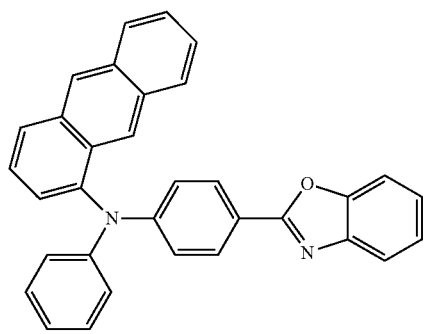
P70
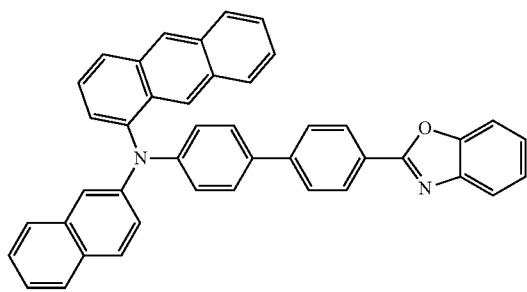
P71
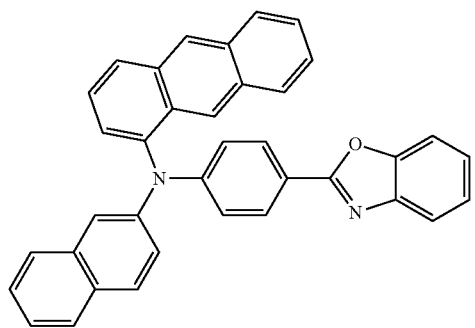
P72

P73
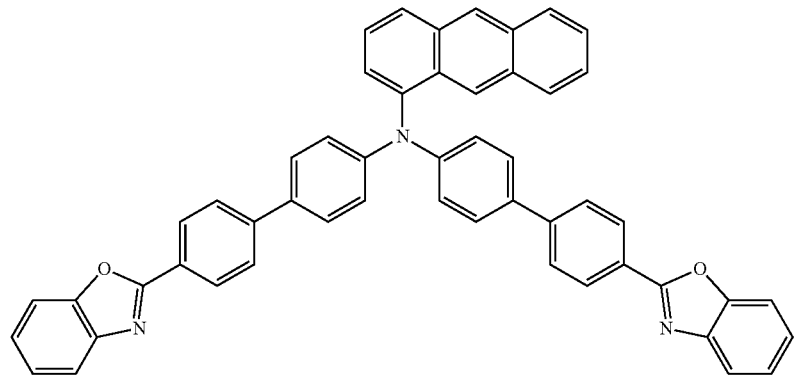
P74
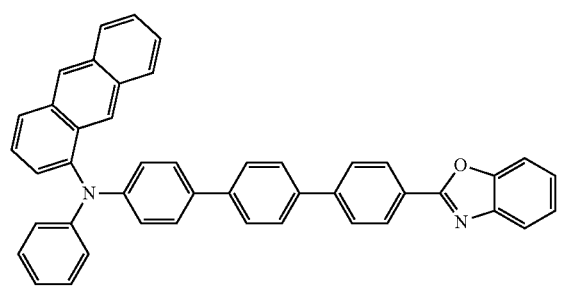
P75
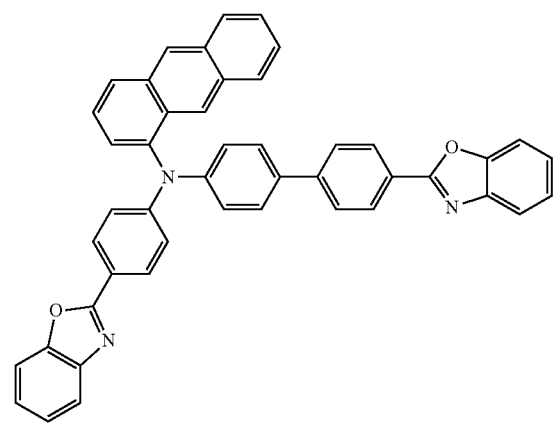
P76
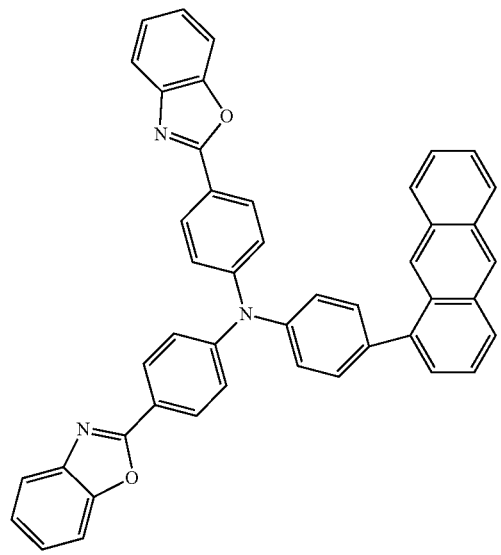
P77
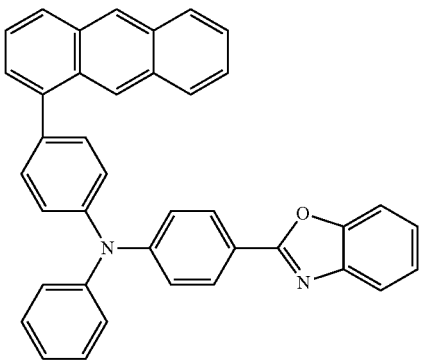

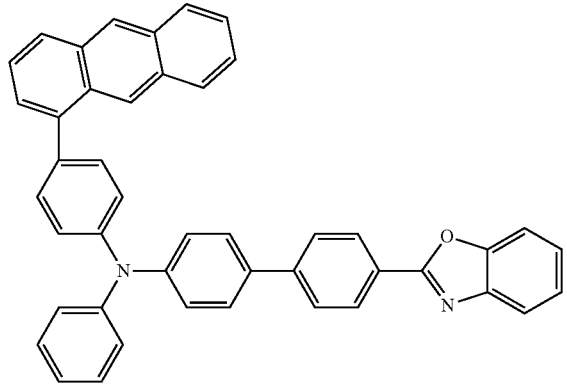
P78
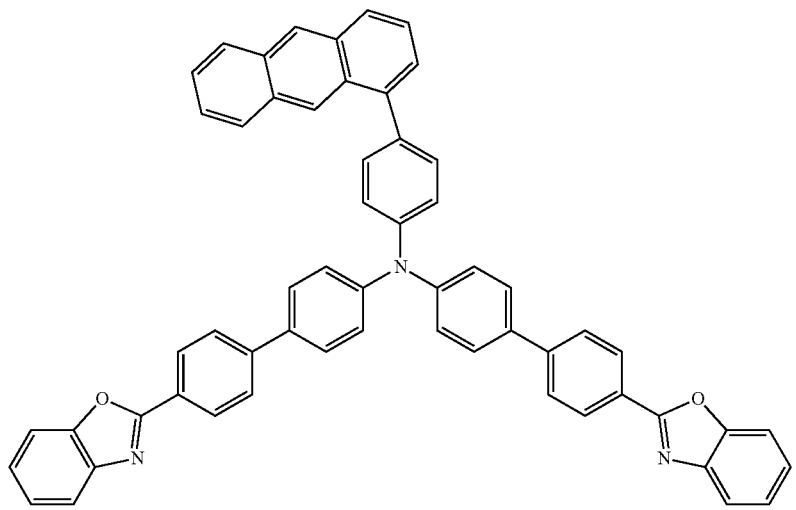
P79
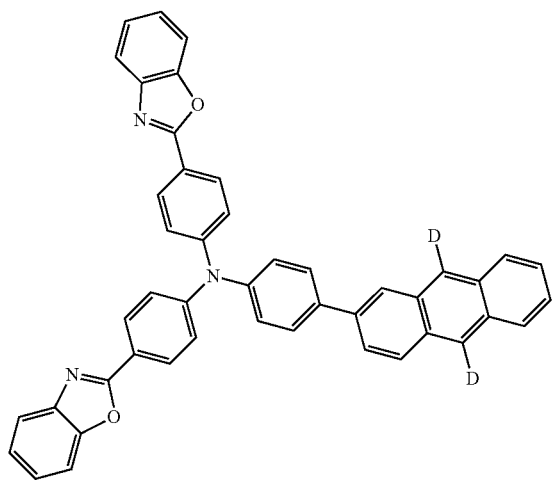
P80
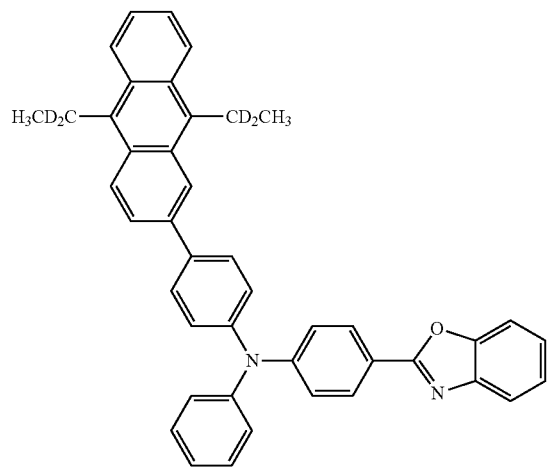
P81

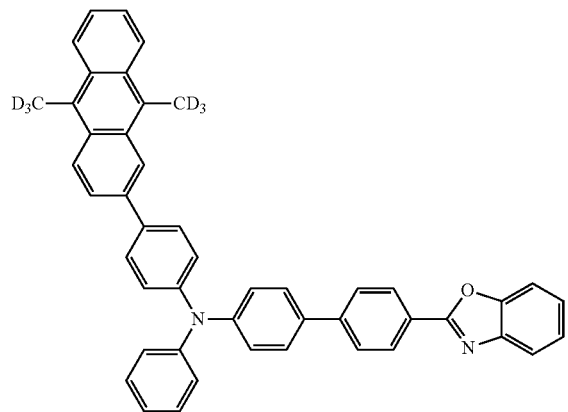
P82
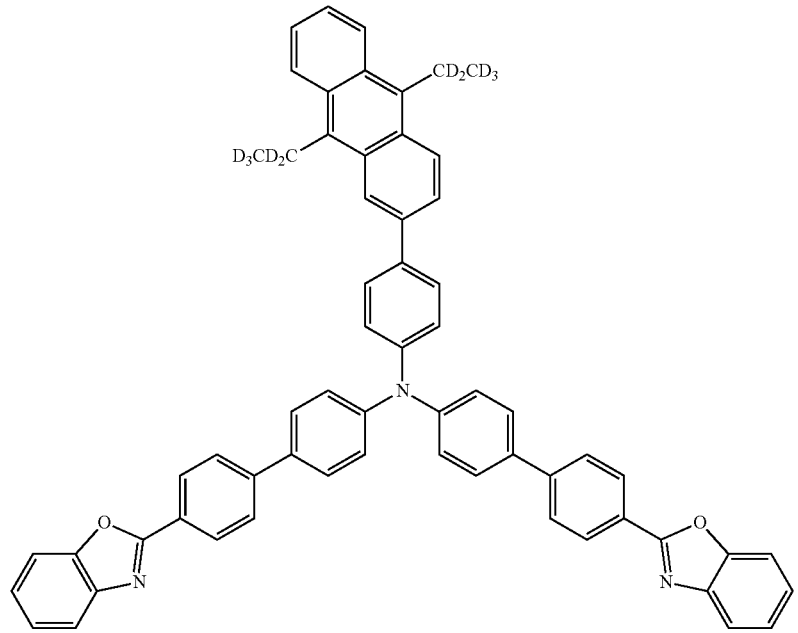
P83
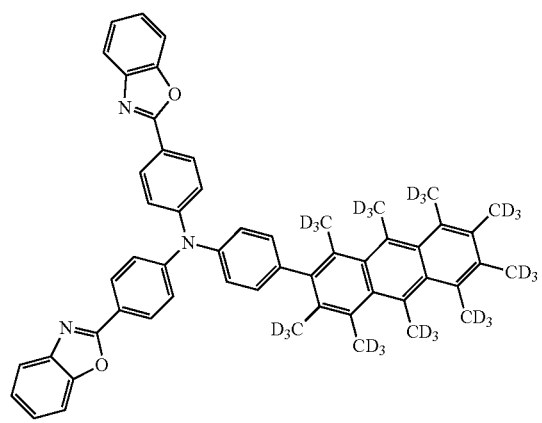
P84
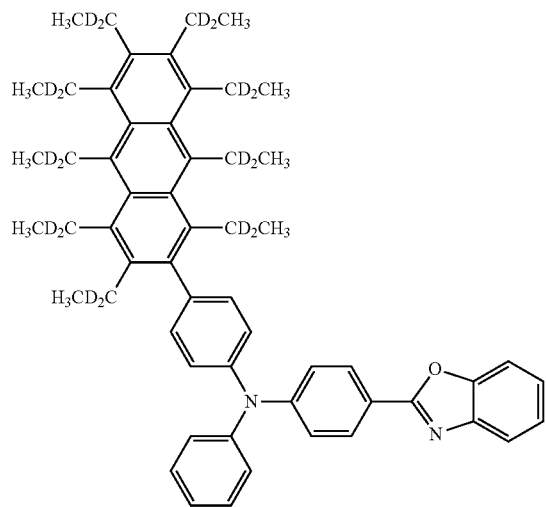
P85

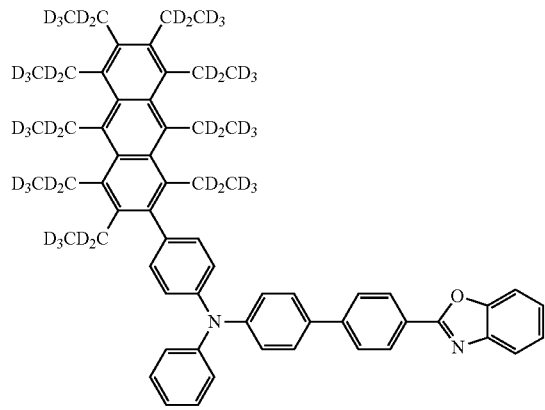
P86
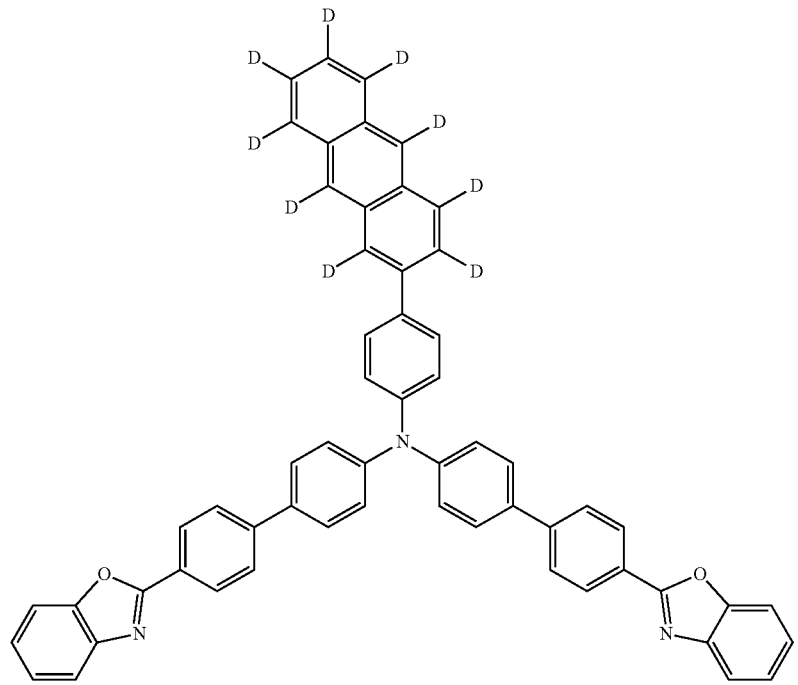
P87
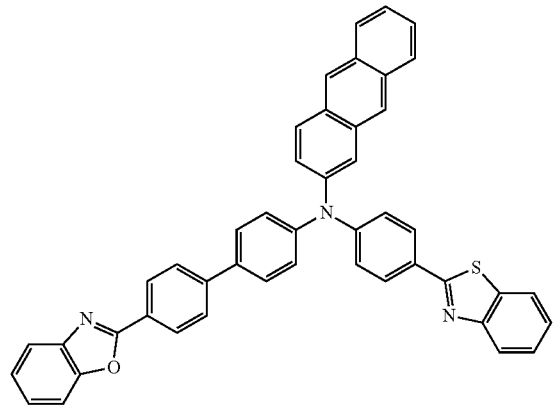
P88

-continued
P89
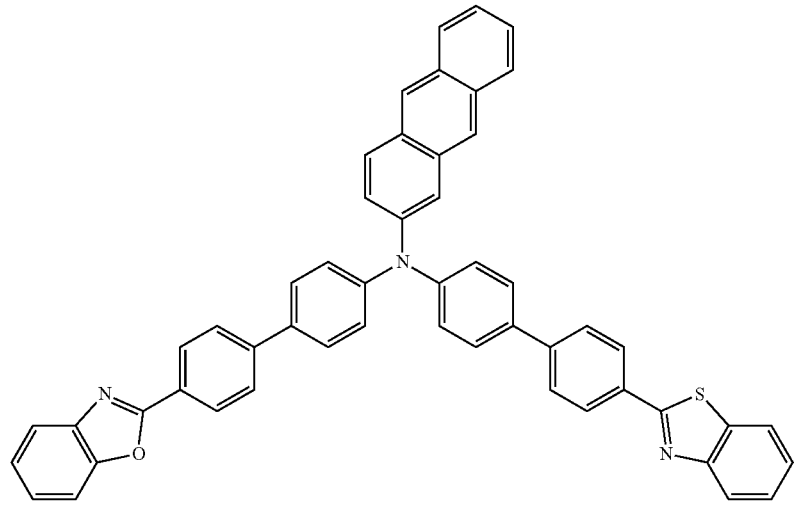
P90 P91
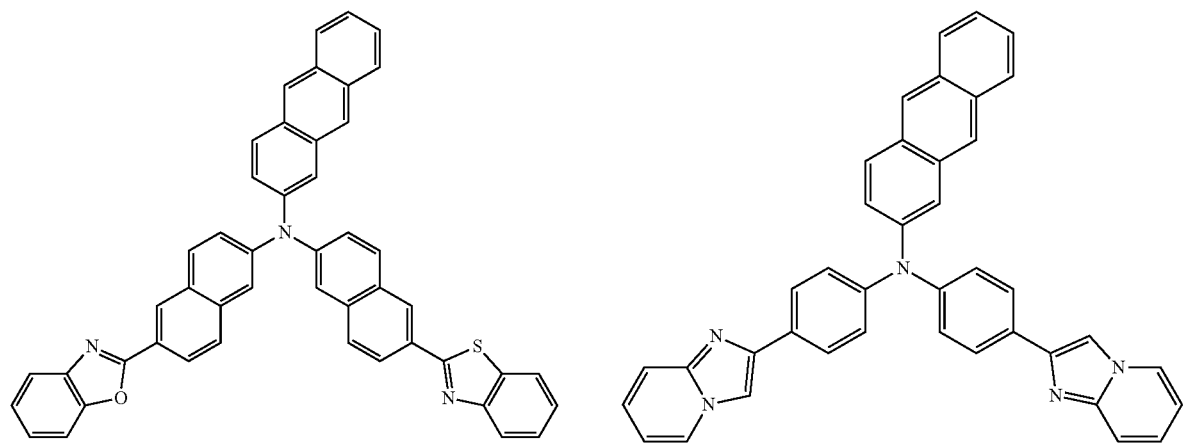
P92
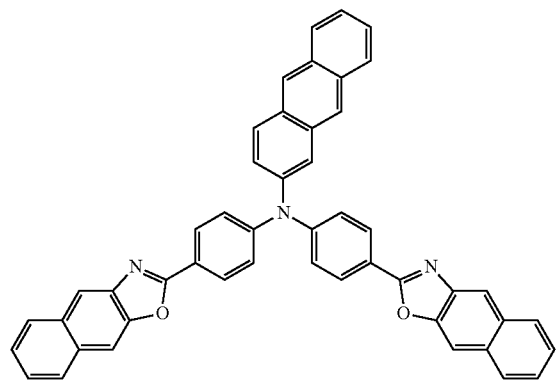

P93
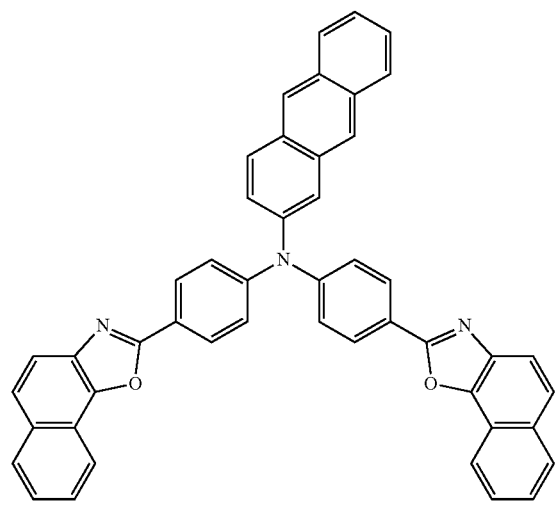
P94
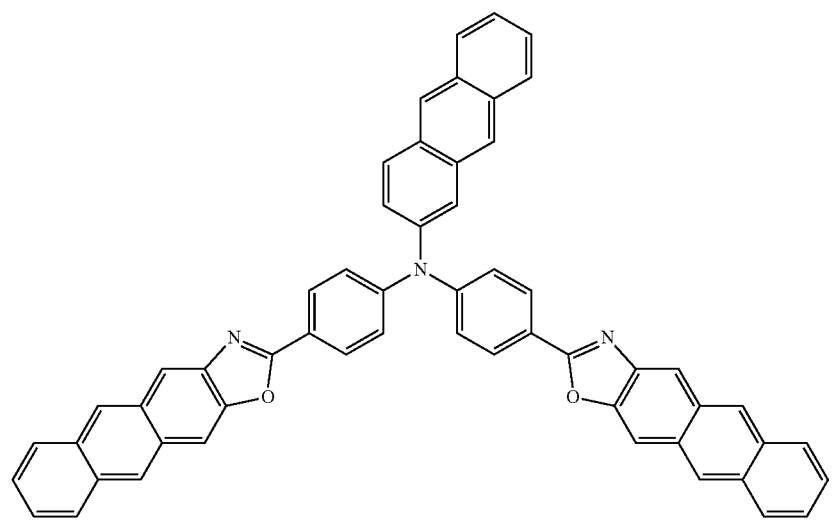
P95
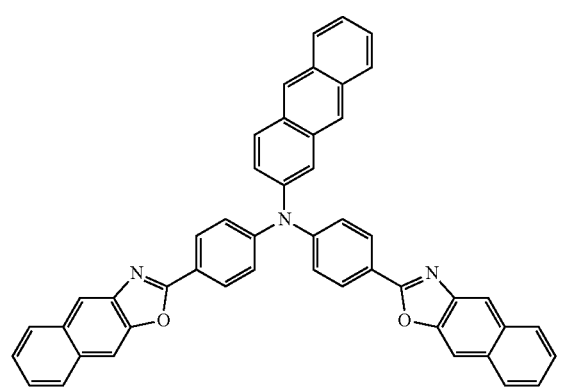
P96
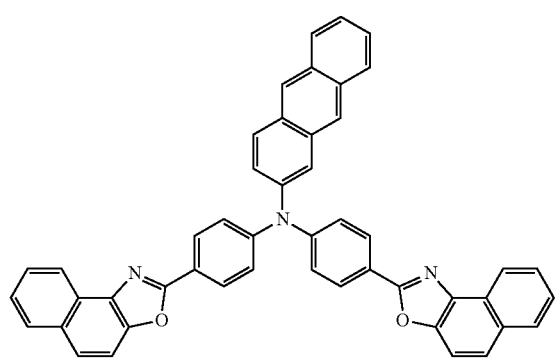

P97
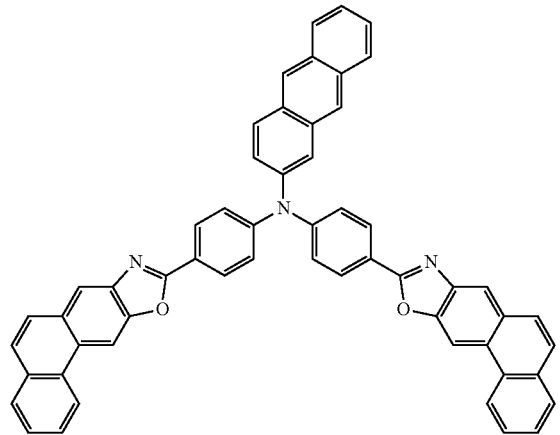
P98
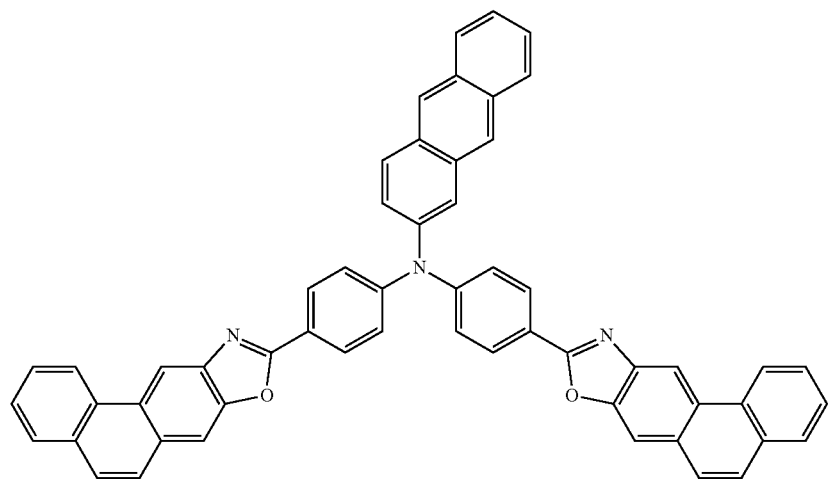
P99 P100
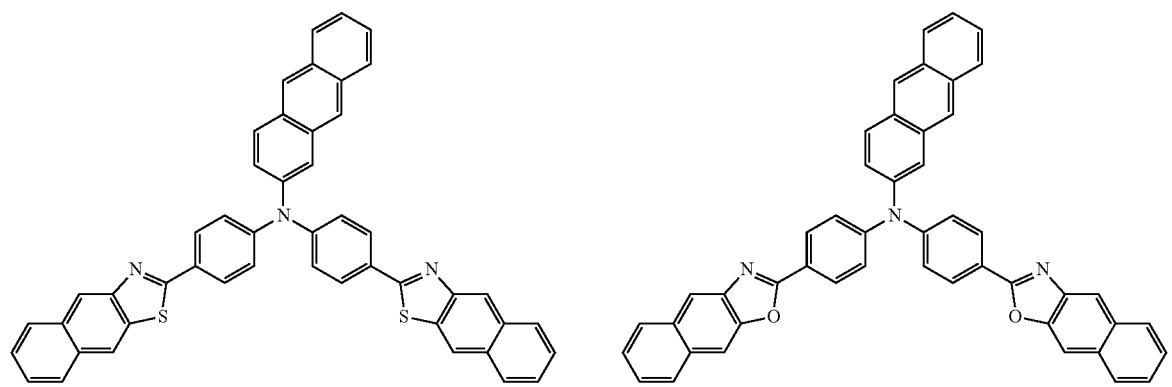

-continued
P101
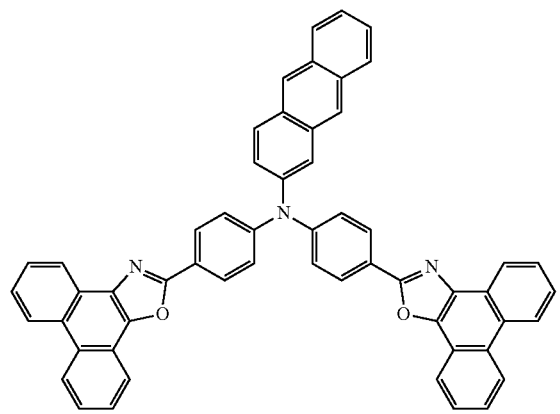
P102
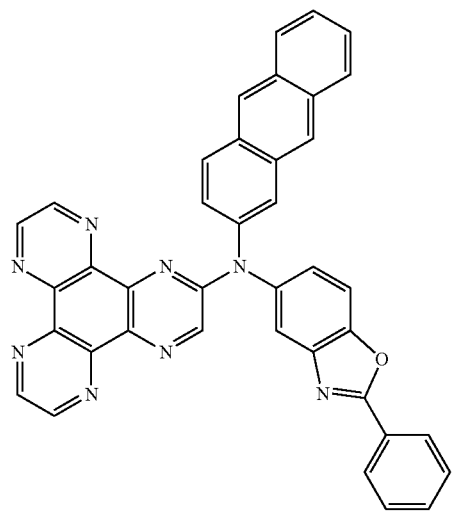
P103
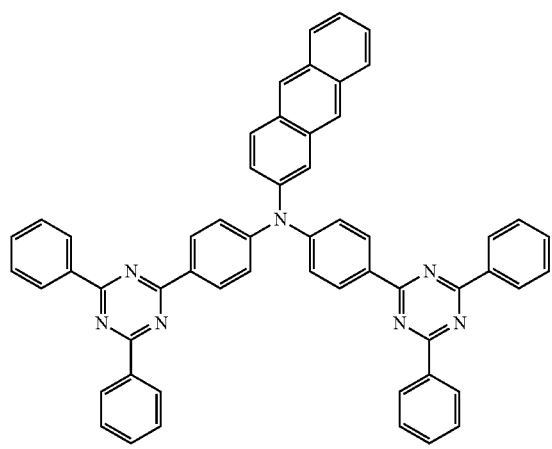
P104
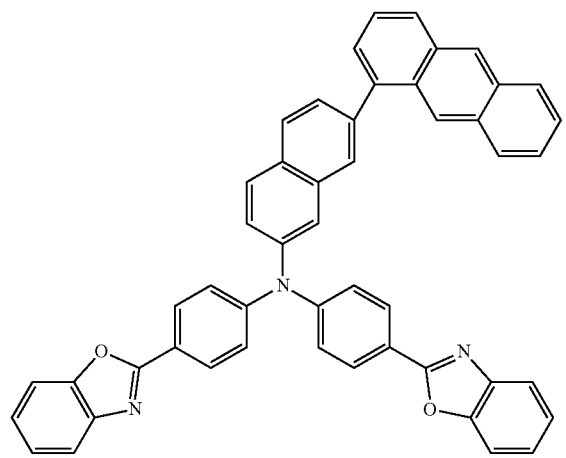
P105
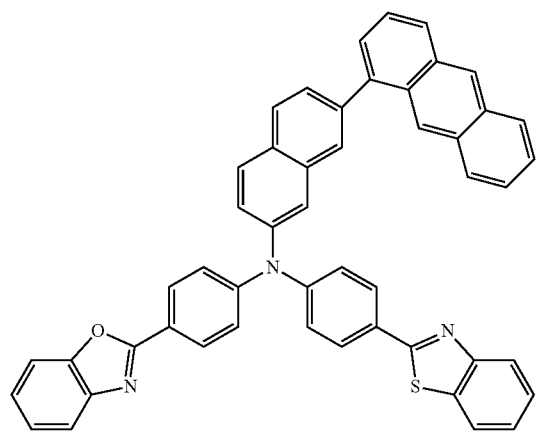
P106
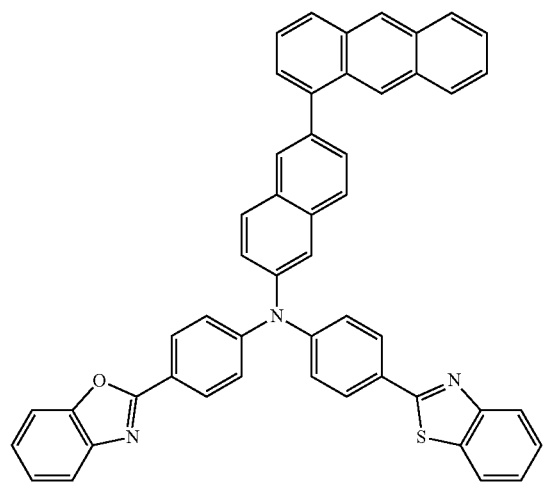

-continued
P107
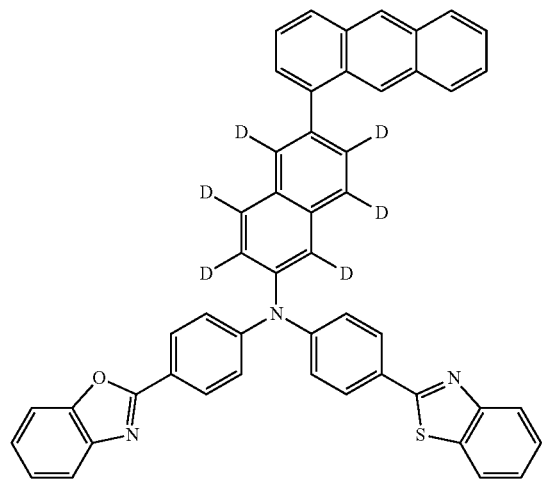
P108
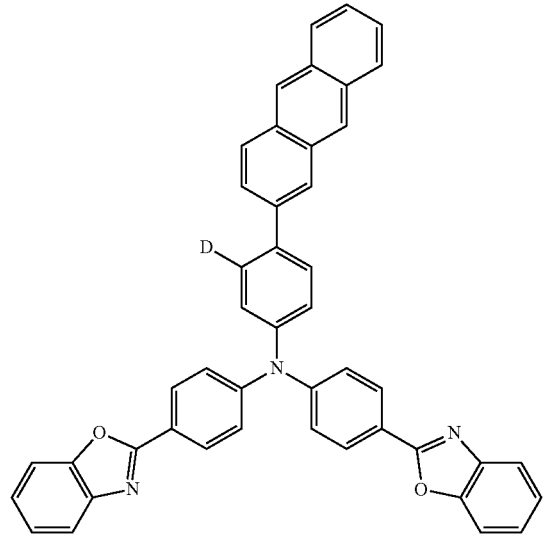
P109
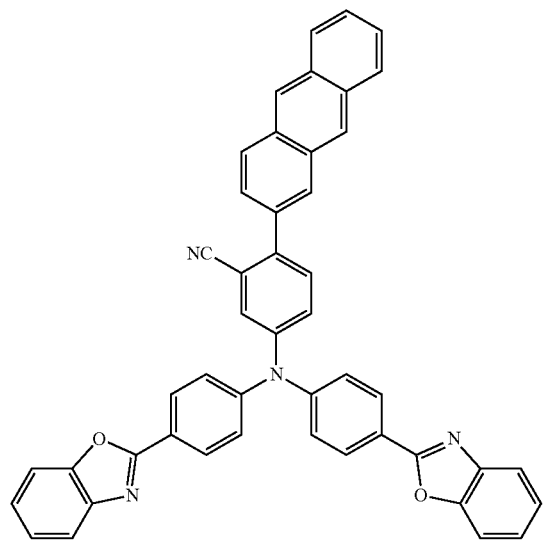
P110
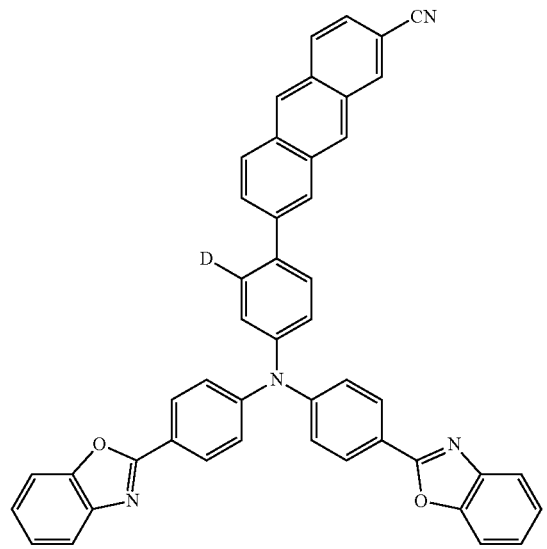

-continued
P111
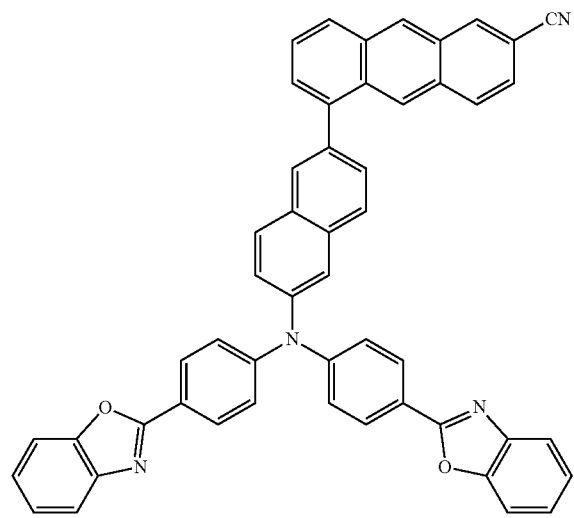
P112
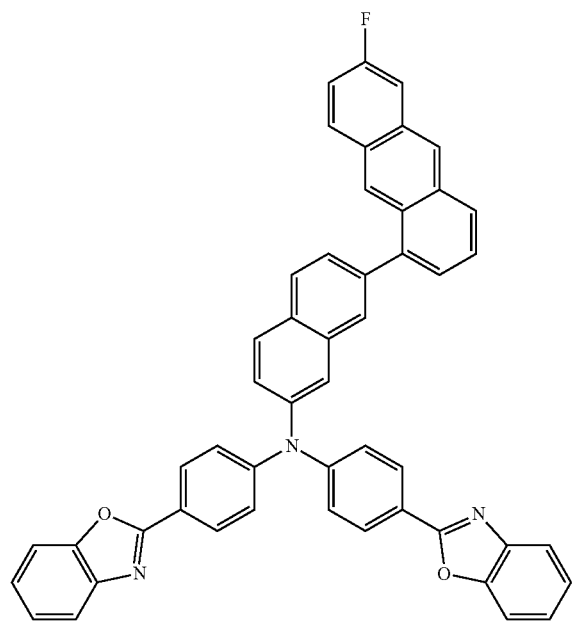
P113
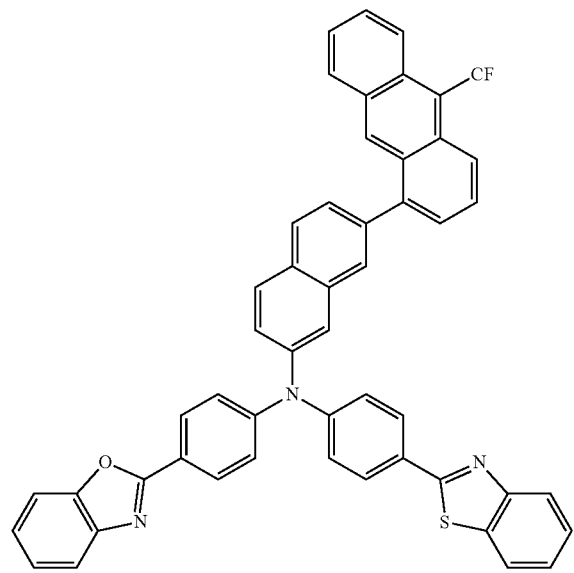
P114
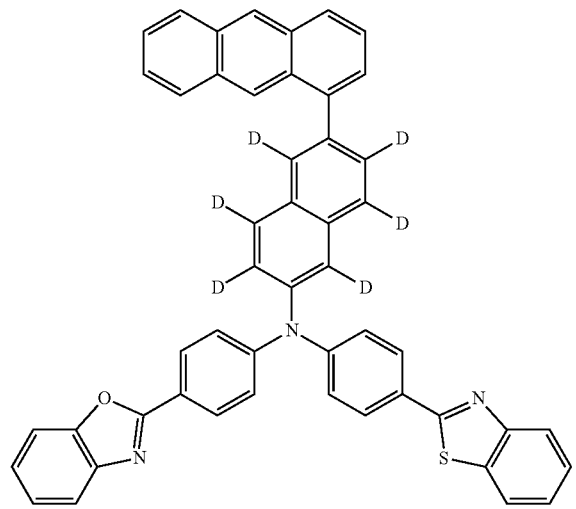

P115
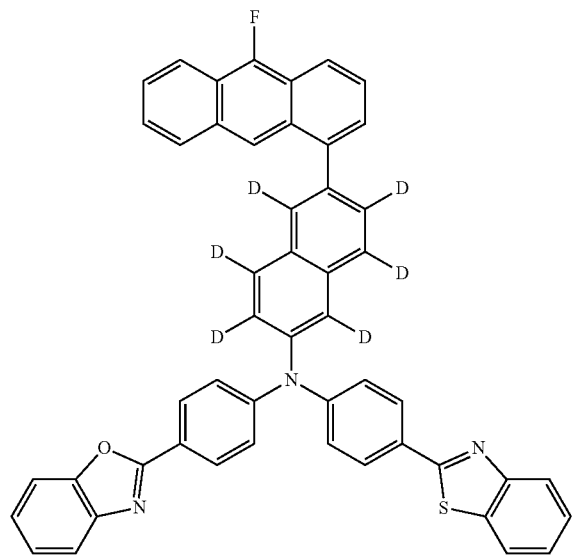
P116
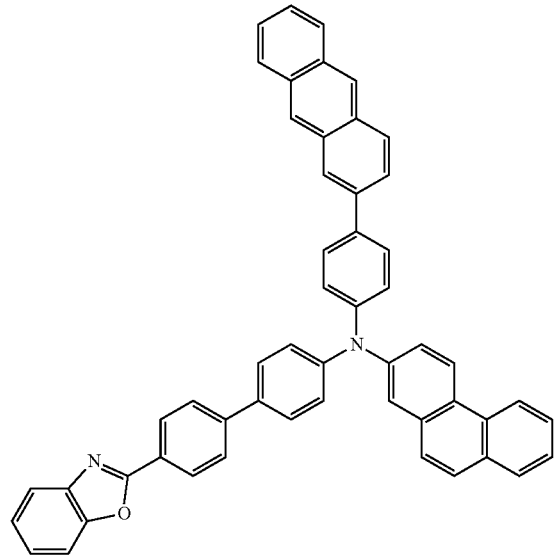
P117
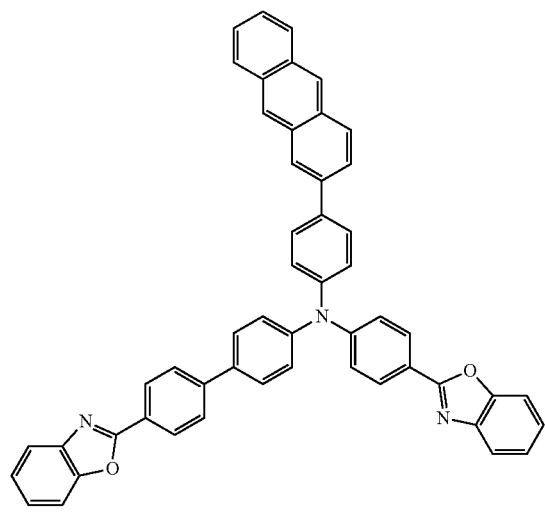
P118
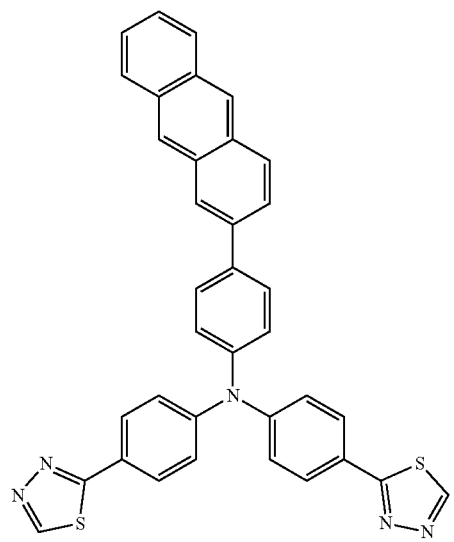

P119
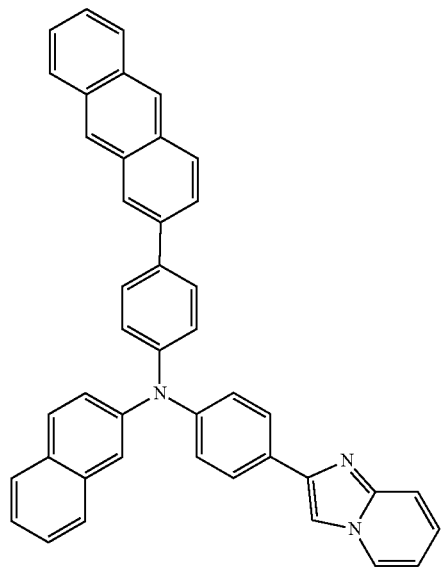
P120
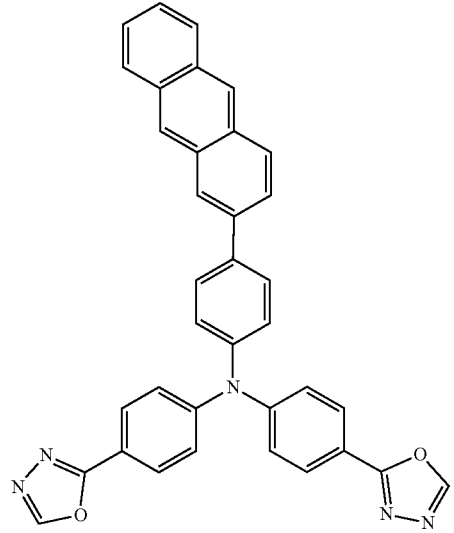
P121
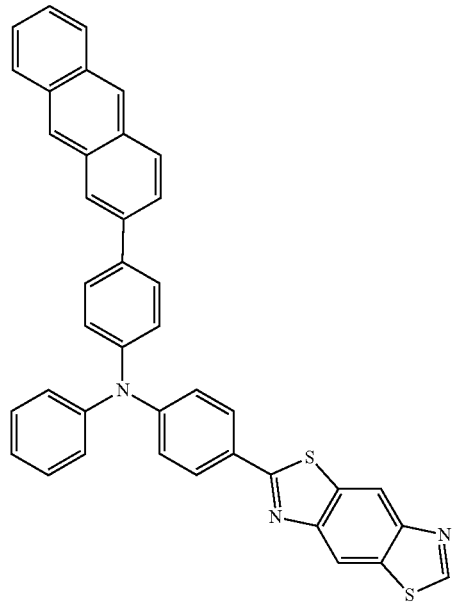
P122
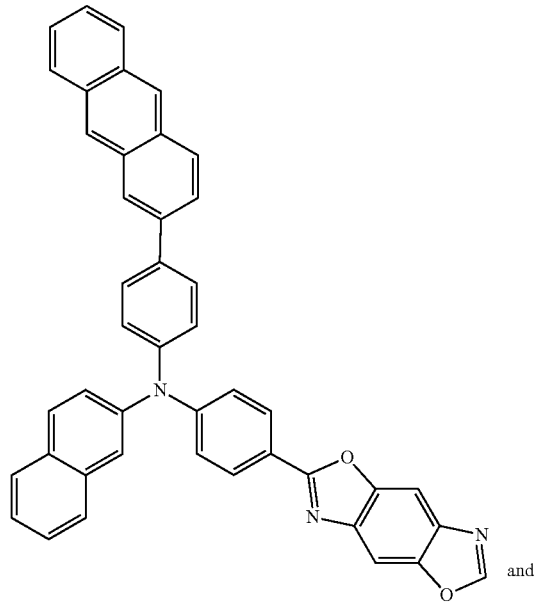
and

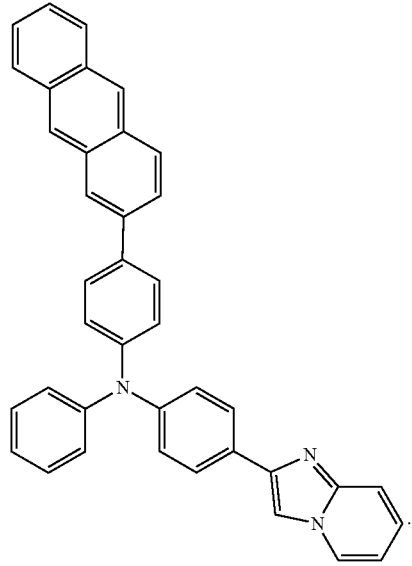

P123

In accordance with another embodiment of the present disclosure, a material for an organic electroluminescent device is provided. The material for an organic electroluminescent device includes any one or a combination of at least two of the compound as described for the first object.

In accordance with another embodiment of the present disclosure, an organic electroluminescent device is provided. The organic electroluminescent device includes a first electrode layer, an organic function layer and a second electrode layer which are stacked in sequence.

The organic function layer includes the material as described for the second object.

In accordance with another embodiment of the present disclosure another organic electroluminescent device is provided. The organic electroluminescent device includes a first capping layer, a first electrode layer, an organic function layer and a second electrode layer which are stacked in sequence.

The first capping layer includes the material as described for the second object.

When the device is a top emitting device, the first electrode layer is a cathode layer and the second electrode layer is an anode layer; when the device is a bottom emitting device, the first electrode layer is an anode layer and the second electrode layer is a cathode layer.

The compound of the present disclosure can interact with a metal in a cathode (or anode) of the device, which reduces a coupling effect between free charges on the surface of the metal and electromagnetic radiation and improves photon extraction efficiency. Meanwhile, this modifies a metal electrode and reduces the possibility of film peeling.

In an embodiment, an organic electroluminescent device provided by the present disclosure, as shown in FIG. 1, includes a substrate 1, an anode 2, a hole injection layer 3, a first hole transport layer 4, a second hole transport layer 5, a light-emitting layer 6, a first electron transport layer 7, a second electron transport layer 8, a cathode 9 and a first capping layer 10.

In an embodiment, the organic electroluminescent device further includes a second capping layer disposed on a side of the first capping layer facing away from the first electrode layer, where the second capping layer includes lithium fluoride and/or a material containing small organic molecules with a refractive index of 1.40-1.65 (for example, 1.41, 1.42, 1.43, 1.44, 1.45, 1.46, 1.47, 1.48, 1.49, 1.50, 1.51, 1.52, 1.53, 1.54, 1.55, 1.56, 1.57, 1.58, 1.59, 1.60, 1.61, 1.62, 1.63, 1.64 or the like).

The organic electroluminescent device provided by the present disclosure preferably includes two capping layers, and the compound provided by the present disclosure is combined with lithium fluoride and/or a material containing small organic molecules with a refractive index of 1.40-1.65, which can alleviate the total reflection of light by a packaging glass, facilitate the transmission of visible light through the glass and improve the light extraction effect.

Figure 2:
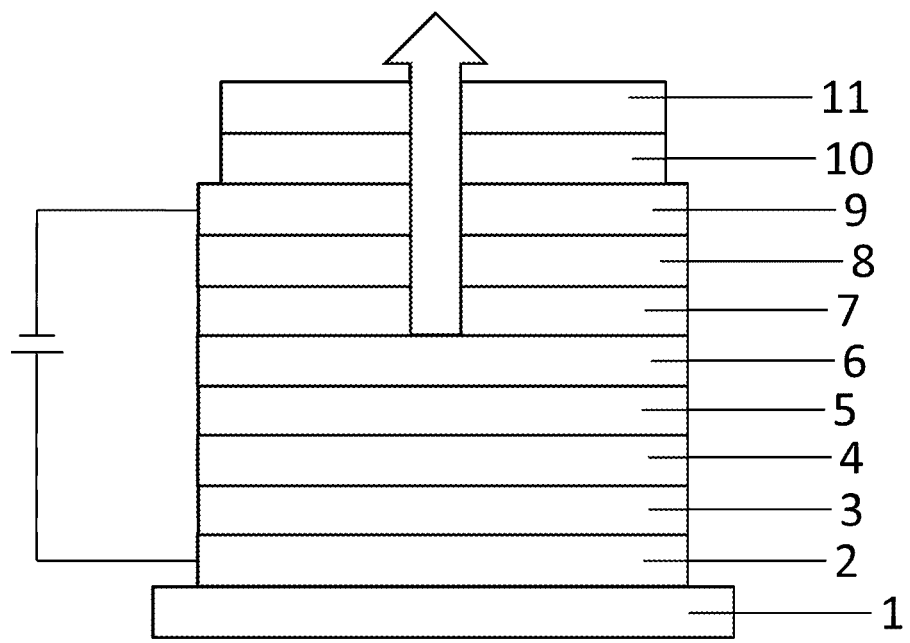
FIG. 2 is a structure diagram of an organic electroluminescent device according to another embodiment of the present disclosure.

In an embodiment, the organic electroluminescent device provided by the present disclosure, as shown in FIG. 2, includes a substrate 1, an anode 2, a hole injection layer 3, a first hole transport layer 4, a second hole transport layer 5, a light-emitting layer 6, a first electron transport layer 7, a second electron transport layer 8, a cathode 9, a first capping layer 10 and a second capping layer 11.

In an embodiment, the material containing small organic molecules with a refractive index of 1.40-1.65 includes, but is not limited to, any one or a combination of at least two of polyfluorocarbons, boron-containing compounds, silicon-containing compounds, oxygen-containing silicon compounds and adamantane-containing alkane compounds.

In accordance with another embodiment of the present disclosure a display panel is provided. The display panel includes the organic electroluminescent device as described for the third object or the fourth object.

In an embodiment, the display panel is a foldable display panel.

When the compound provided by the present disclosure is used in the foldable display panel for display at multiple angles, light extraction Δn is small for RGB colors, which can effectively reduce a color cast.

In accordance with another embodiment of the present disclosure a display device is provided. The display device includes the display panel as described for the fifth object.

The method for preparing the compound provided by the present disclosure belongs to the related art, and those skilled in the art can select a specific synthesis method according to conventional technical knowledge. The present disclosure provides only an exemplary synthesis route and is not limited to the following synthesis routes.

The representative synthesis route of the compound of Formula (1) provided by the present disclosure is as follows:

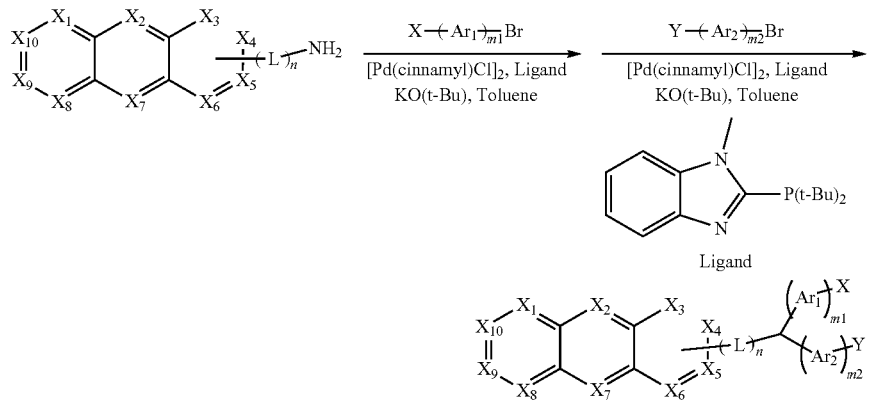

where KO(t-Bu) represents potassium tert-butoxide, Toluene represents toluene, and [Pd(cinnamyl)Cl]₂ represents palladium chloride (1-phenylallyl).

The following examples exemplarily provide specific synthesis methods for a series of compounds. For compounds whose specific synthesis methods are not mentioned, these compounds may be synthesized by similar methods or other existing methods, which are not specifically limited in the present disclosure.

Example 1

Synthesis of Compound P4

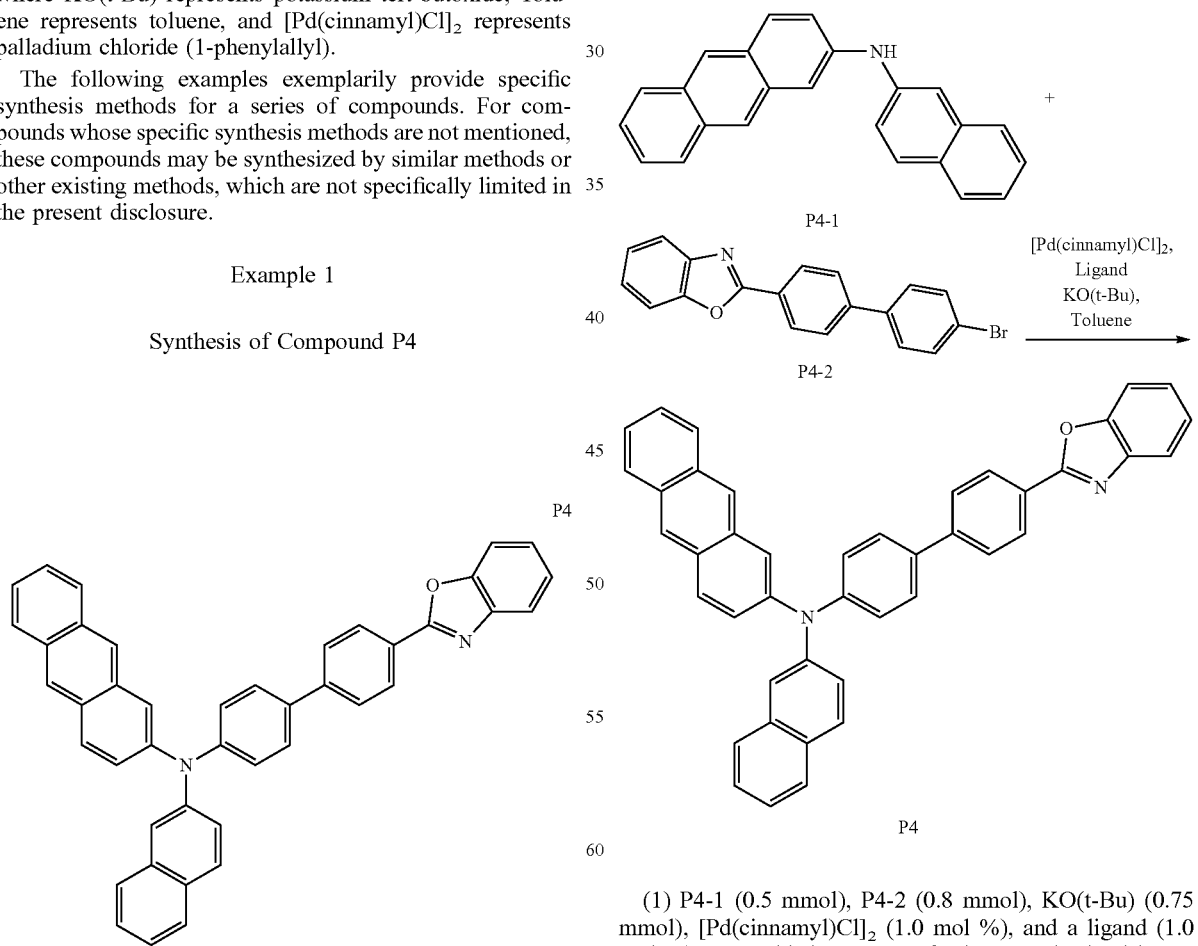

A specific preparation method specifically includes steps described below.

(1) P4-1 (0.5 mmol), P4-2 (0.8 mmol), KO(t-Bu) (0.75 mmol), [Pd(cinnamyl)Cl]₂ (1.0 mol %), and a ligand (1.0 mol %) were added to 3 mL of toluene and mixed into a solution, and the solution was put in a 50 mL flask and reacted at 80° C. for 12 h. Then the solution was cooled to room temperature and slowly added with a saturated aqueous solution of MgSO₄ and ethyl acetate to be extracted for three times. Then, the organic layer passed through a rotary evaporator for the solvent to be removed and the crude product P4 was obtained through column chromatography.

The structure of the target product P4 was tested through matrix-assisted laser desorption/ionization time-of-flight mass spectrometry (MALDI-TOF-MS) (m/z) to obtain $C_{43}H_{28}N_2O$ whose calculated value was 588.2 and measured value was 588.1.

Elemental analysis: theoretical value: C, 87.73, H, 4.79; N, 4.76; measured value: C, 87.73; H, 4.79; N, 4.77.

Example 2

Synthesis of Compound P8

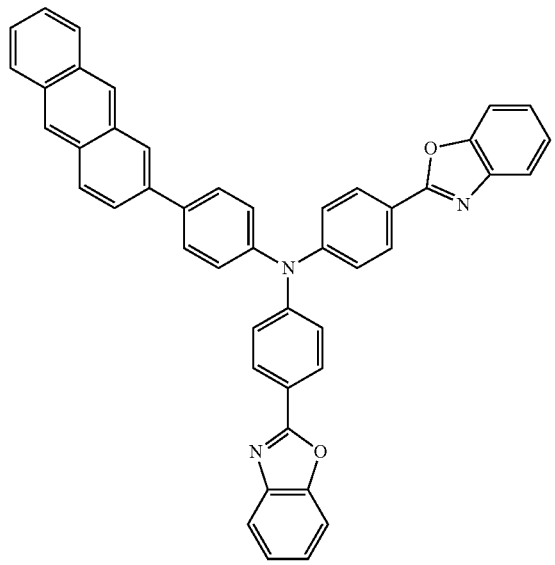

P8

A specific preparation method specifically includes steps described below.

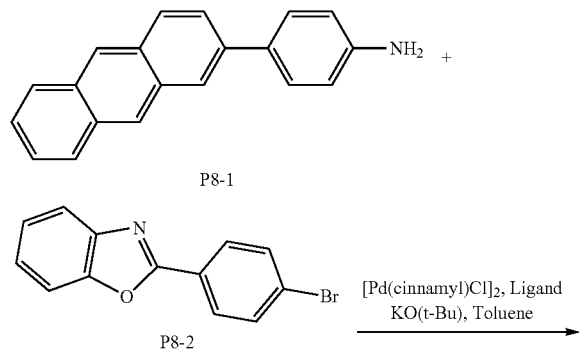

(1) P8-1 (0.5 mmol), P8-2 (1.5 mmol), KO(t-Bu) (0.75 mmol), [Pd(cinnamyl)Cl]₂ (2 mol %), and a ligand (1.5 mol %) were added to 3 mL of toluene and mixed into a solution, and the solution was put in a 50 mL flask and reacted at 80° C. for 12 h. Then the solution was cooled to room temperature and slowly added with a saturated aqueous solution of MgSO₄ and ethyl acetate to be extracted for three times. Then, the organic layer passed through a rotary evaporator for the solvent to be removed and the crude product P8 was obtained through column chromatography.

The structure of the target product P8 was tested through matrix-assisted laser desorption/ionization time-of-flight mass spectrometry (MALDI-TOF-MS) (m/z) to obtain $C_{46}H_{29}N_3O_2$ whose calculated value was 655.2 and measured value was 655.1.

Elemental analysis: theoretical value: C, 84.25, H, 4.46; N, 6.41; measured value: C, 84.25; H, 4.45; N, 6.41.

Example 3

Synthesis of Compound P80

P80

A specific preparation method specifically includes steps described below.

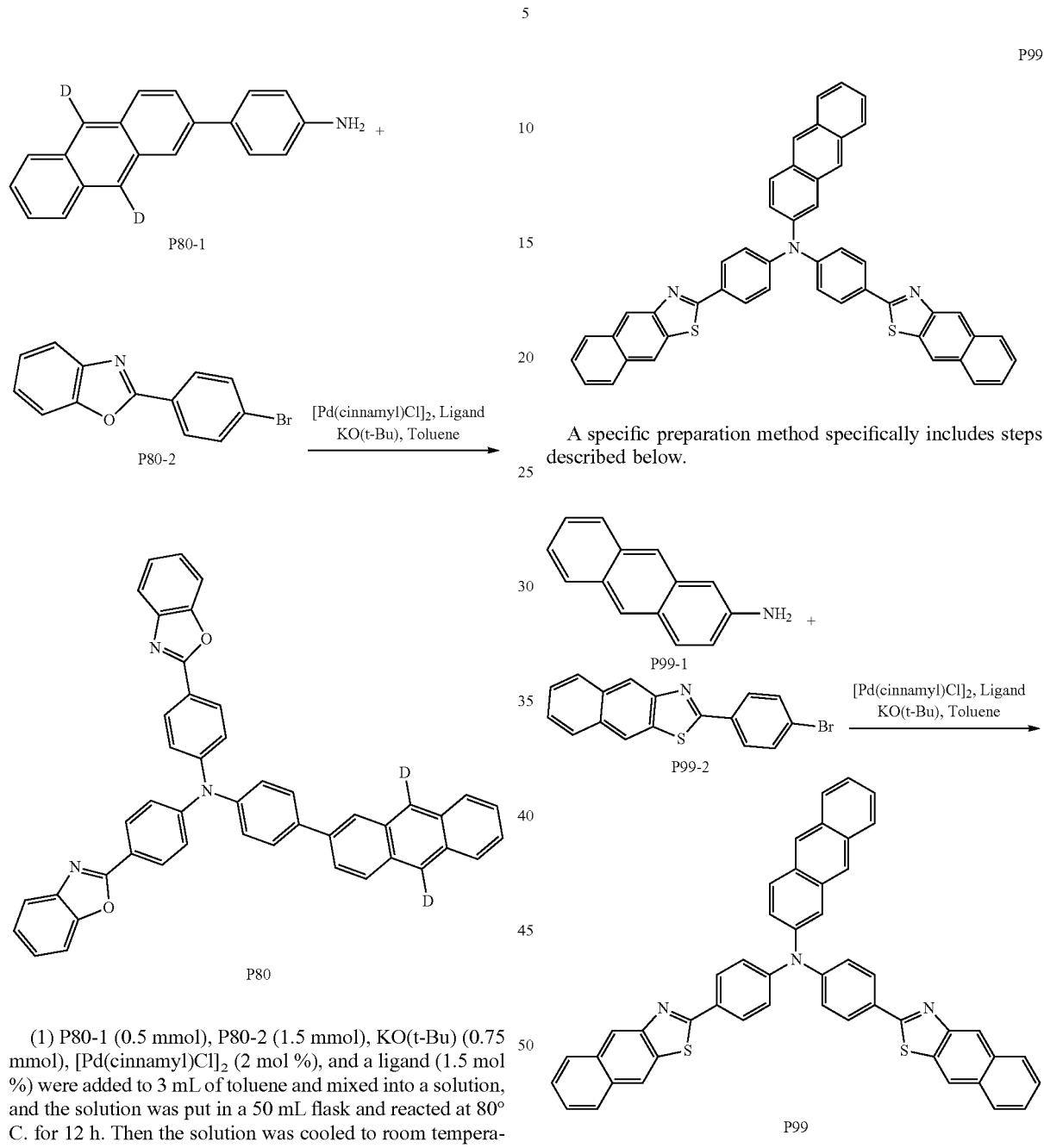

Example 4

Synthesis of Compound P99

(1) P80-1 (0.5 mmol), P80-2 (1.5 mmol), KO(t-Bu) (0.75 mmol), [Pd(cinnamyl)Cl]$_2$ (2 mol %), and a ligand (1.5 mol %) were added to 3 mL of toluene and mixed into a solution, and the solution was put in a 50 mL flask and reacted at 80° C. for 12 h. Then the solution was cooled to room temperature and slowly added with a saturated aqueous solution of MgSO$_4$ and ethyl acetate to be extracted for three times. Then, the organic layer passed through a rotary evaporator for the solvent to be removed and the crude product P80 was obtained through column chromatography.

The structure of the target product P80 was tested through matrix-assisted laser desorption/ionization time-of-flight mass spectrometry (MALDI-TOF-MS) (m/z) to obtain $C_{46}H_{27}D_2N_3O_2$ whose calculated value was 657.2 and measured value was 657.1.

Elemental analysis: theoretical value: C, 84.00, H, 4.75; N, 6.39; measured value: C, 84.00; H, 4.75; N, 6.39.

A specific preparation method specifically includes steps described below.

(1) P99-1 (0.5 mmol), P99-2 (1.5 mmol), KO(t-Bu) (0.75 mmol), [Pd(cinnamyl)Cl]$_2$ (2 mol %), and a ligand (1.5 mol %) were added to 3 mL of toluene and mixed into a solution, and the solution was put in a 50 mL flask and reacted at 80° C. for 12 h. Then the solution was cooled to room temperature and slowly added with a saturated aqueous solution of MgSO$_4$ and ethyl acetate to be extracted for three times. Then, the organic layer passed through a rotary evaporator for the solvent to be removed and the crude product P99 was obtained through column chromatography.

The structure of the target product P99 was tested through matrix-assisted laser desorption/ionization time-of-flight mass spectrometry (MALDI-TOF-MS) (m/z) to obtain $C_{48}H_{29}N_3S_2$ whose calculated value was 711.2 and measured value was 711.1.

Elemental analysis: theoretical value: C, 80.98, H, 4.11; N, 5.90; measured value: C, 80.98; H, 4.10; N, 5.90.

Example 5

Synthesis of Compound P109

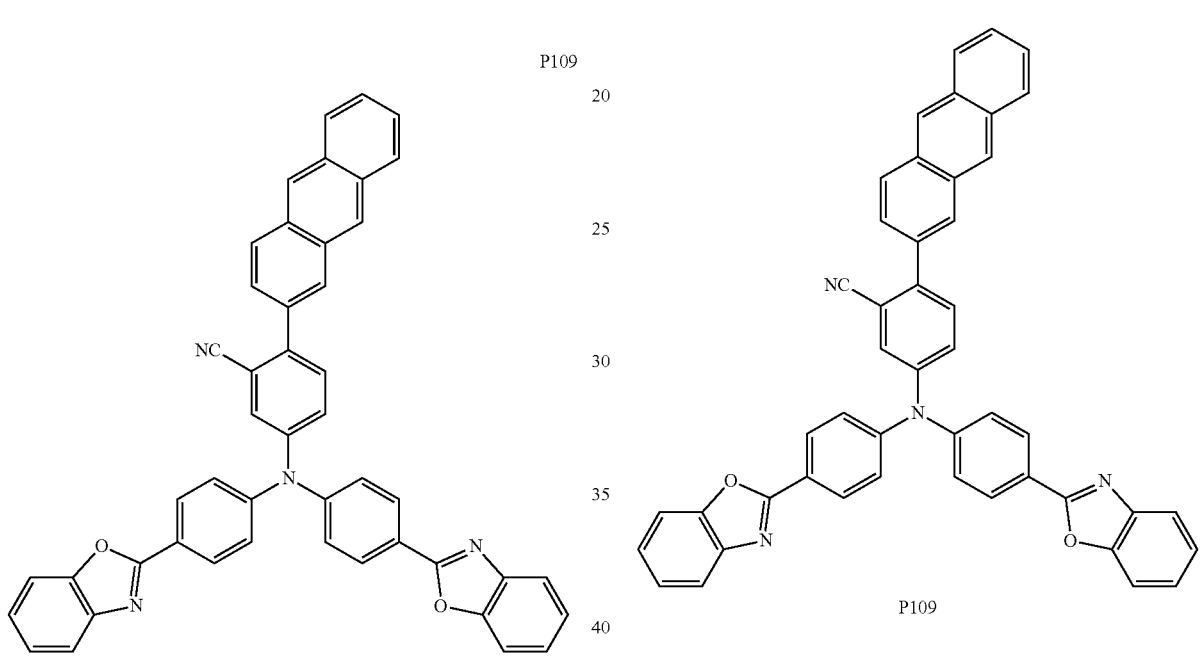

A specific preparation method specifically includes steps described below.

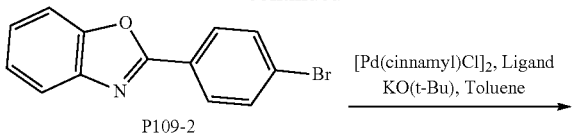

(1) P109-1 (0.5 mmol), P109-2 (1.5 mmol), KO(t-Bu) (0.75 mmol), [Pd(cinnamyl)Cl]₂ (2 mol %), and a ligand (1.5 mol %) were added to 3 mL of toluene and mixed into a solution, and the solution was put in a 50 mL flask and reacted at 80° C. for 12 h. Then the solution was cooled to room temperature and slowly added with a saturated aqueous solution of MgSO₄ and ethyl acetate to be extracted for three times. Then, the organic layer passed through a rotary evaporator for the solvent to be removed and the crude product P109 was obtained through column chromatography.

The structure of the target product P109 was tested through matrix-assisted laser desorption/ionization time-of-flight mass spectrometry (MALDI-TOF-MS) (m/z) to obtain $C_{47}H_{28}N_4O_2$ whose calculated value was 680.2 and measured value was 680.1.

Elemental analysis: theoretical value: C, 82.92, H, 4.15; N, 8.23; measured value: C, 82.92; H, 4.16; N, 8.23.

The preparation methods of the compounds of the present disclosure used in specific examples are all similar to the preceding methods and not repeated herein. Only the characterization results of these compounds are provided. The results of mass spectrometry and elemental analysis are shown in Table 1.

TABLE 1

| Compound | Result of Mass Spectrometry | | Result of Elemental Analysis | |
|---|---|---|---|---|
| | Calculated Value | Measured Value | Theoretical Value | Measured Value |
| P14 | 664.3 | 664.2 | C, 88.53; H, 4.85; N, 4.21; | C, 88.52; H, 4.85; N, 4.22; |
| P61 | 631.2 | 631.1 | C, 83.65; H, 4.63; N, 6.65; | C, 83.65; H, 4.64; N, 6.65; |
| P66 | 720.2 | 720.1 | C, 84.97; H, 4.47; N, 3.89; | C, 84.97; H, 4.48; N, 3.88; |
| P67 | 654.2 | 654.1 | C, 86.21; H, 4.62; N, 4.28; | C, 86.21; H, 4.63; N, 4.28; |
| P87 | 816.4 | 816.3 | C, 85.27; H, 5.67; N, 5.14; | C, 85.28; H, 5.67; N, 5.14; |
| P101 | 779.3 | 779.2 | C, 86.24; H, 4.27; N, 5.39; | C, 86.24; H, 4.28; N, 5.39; |
| P102 | 618.2 | 618.1 | C, 75.72; H, 3.58; N, 18.11; | C, 75.72; H, 3.59; N, 18.11; |
| P103 | 807.3 | 807.1 | C, 83.25; H, 4.62; N, 12.14; | C, 83.25; H, 4.63; N, 12.14; |
| P120 | 557.2 | 557.0 | C, 77.54; H, 4.16; N, 12.56; | C, 77.55; H, 4.16; N, 12.56; |
| P122 | 629.2 | 629.1 | C, 83.92; H, 4.32; N, 6.67; | C, 83.92; H, 4.33; N, 6.68; |
| P123 | 537.2 | 537.3 | C, 87.12; H, 5.06; N, 7.82; | C, 87.12; H, 5.06; N, 7.82; |

Performance Test I Characterization of Refractive Indexes of Materials

The refractive indexes of the compounds at wavelengths of 460 nm, 530 nm and 620 nm were tested by an ellipsometer. A difference $\Delta n_1$ between the refractive index at the wavelength of 460 nm and the refractive index at the wavelength of 530 nm, a difference $\Delta n_2$ between the refractive index at the wavelength of 530 nm and the refractive index at the wavelength of 620 nm, and a difference $\Delta n_3$ between the refractive index at the wavelength of 460 nm and the refractive index at the wavelength of 620 nm were calculated.

The results of the preceding test are shown in Table 2.

TABLE 2

| Compound | $n_{460\ nm}$ | $n_{530\ nm}$ | $n_{620\ nm}$ | $\Delta n_1$ | $\Delta n_2$ | $\Delta n_3$ |
|---|---|---|---|---|---|---|
| P4 | 2.16 | 2.06 | 2.03 | 0.10 | 0.03 | 0.13 |
| P8 | 2.31 | 2.19 | 2.15 | 0.12 | 0.04 | 0.16 |
| P80 | 2.31 | 2.20 | 2.17 | 0.11 | 0.03 | 0.14 |
| P99 | 2.33 | 2.17 | 2.12 | 0.16 | 0.05 | 0.21 |
| P109 | 2.35 | 2.20 | 2.15 | 0.15 | 0.05 | 0.20 |
| P14 | 2.17 | 2.06 | 2.00 | 0.11 | 0.06 | 0.17 |
| P61 | 2.18 | 2.06 | 2.01 | 0.12 | 0.05 | 0.17 |
| P66 | 2.15 | 2.05 | 2.01 | 0.10 | 0.04 | 0.14 |
| P67 | 2.18 | 2.05 | 2.00 | 0.13 | 0.05 | 0.18 |
| P87 | 2.26 | 2.11 | 2.05 | 0.15 | 0.06 | 0.21 |
| P101 | 2.26 | 2.09 | 2.01 | 0.17 | 0.08 | 0.25 |
| P102 | 2.20 | 2.10 | 2.06 | 0.10 | 0.04 | 0.14 |
| P103 | 2.16 | 2.04 | 1.98 | 0.12 | 0.06 | 0.18 |
| P120 | 2.25 | 2.09 | 2.02 | 0.16 | 0.07 | 0.23 |
| P122 | 2.18 | 2.05 | 1.97 | 0.13 | 0.08 | 0.21 |
| P123 | 2.14 | 2.04 | 2.01 | 0.10 | 0.03 | 0.13 |
| C1 | 2.09 | 1.81 | 1.72 | 0.18 | 0.09 | 0.27 |
| C2 | 2.04 | 1.92 | 1.81 | 0.12 | 0.11 | 0.23 |

Comparative compounds C1 and C2 have the following structures:

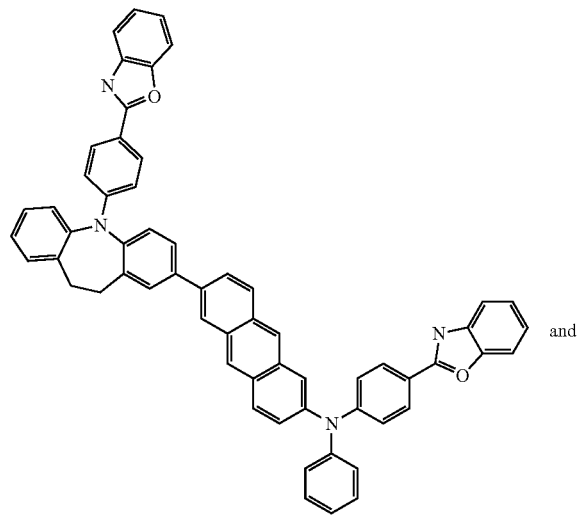

C1

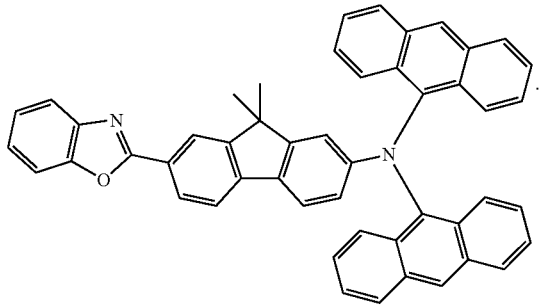

C2

It can be seen from Table 2 that the compounds provided by the present disclosure satisfy that the difference between the refractive index at the wavelength of 460 nm and the refractive index at the wavelength of 530 nm is 0.10-0.17, the difference between the refractive index at the wavelength of 530 nm and the refractive index at the wavelength of 620 nm is 0.03-0.10, and the difference between the refractive index at the wavelength of 460 nm and the refractive index at the wavelength of 620 nm is 0.15-0.40. When used in the organic electroluminescent device especially as a material for a capping layer, the compounds provided by the present disclosure can effectively improve the color cast while achieving display at multiple angles. Though compounds C1 and C2 have similar results to the compounds of the present disclosure, an anthryl group of C1 is substituted with a complex heterocyclic group, resulting in a too large volume of the molecule and a decrease of the refractive index, and an arylamino group of C2 is linked to a middle benzene ring of the anthryl group so that the conjugation area of the entire molecule cannot be optimized to the full, the molecule is torched at a larger angle, and the molecular planarity decreases, resulting in a decrease of the light-emitting efficiency of the molecule.

For a better understanding of the present disclosure, application examples of the compounds of the present disclosure are listed below. It is to be understood by those skilled in the art that the examples described herein are used for a better understanding of the present disclosure and not to be construed as specific limitations to the present disclosure.

Application Example 1

This application example provides an organic electroluminescent device which has a structure shown in FIG. 1 and is prepared through specific steps described below.

(1) A glass substrate with an indium tin oxide (ITO) anode layer 2 (with a thickness of 15 nm) was cut into a size of 50 mm×50 mm×0.7 mm, sonicated in isopropyl alcohol and deionized water for 30 min separately, and cleaned under ozone for 10 min. The cleaned substrate 1 was installed onto a vacuum deposition device.

(2) A material for a hole injection layer, Compound 2, and a p-doping material, Compound 1, were co-deposited at a doping ratio of 3% (mass ratio) by means of vacuum evaporation on the ITO anode layer 2 as a hole injection layer 3 with a thickness of 5 nm.

(3) A material for a hole transport layer, Compound 2, was deposited by means of vacuum evaporation on the hole injection layer 3 as a first hole transport layer 4 with a thickness of 100 nm.

(4) A hole transport material, Compound 3, was deposited by means of vacuum evaporation on the first hole transport layer 4 as a second hole transport layer 5 with a thickness of 5 nm.

(5) A light-emitting layer 6 with a thickness of 30 nm was deposited by means of vacuum evaporation on the second hole transport layer 5, where Compound 4 was doped as a host material with Compound 5 as a doping material at a ratio of 3% (mass ratio).

(6) An electron transport material, Compound 6, was deposited by means of vacuum evaporation on the light-emitting layer 6 as a first electron transport layer 7 with a thickness of 30 nm.

(7) An electron transport material, Compound 7, and a n-doping material, Compound 8, were co-deposited at a doping mass ratio of 1:1 by means of vacuum evaporation on the first electron transport layer 7 as a second electron transport layer 8 with a thickness of 5 nm.

(8) A magnesium-silver electrode was deposited at a ratio of 9:1 by means of vacuum evaporation on the second electron transport layer 8 as a cathode 9 with a thickness of 10 nm.

(9) Compound P4 of the present disclosure was deposited by means of vacuum evaporation on the cathode 9 as a capping layer 10 with a thickness of 100 nm.

The compounds used in the preceding steps have the following structures:

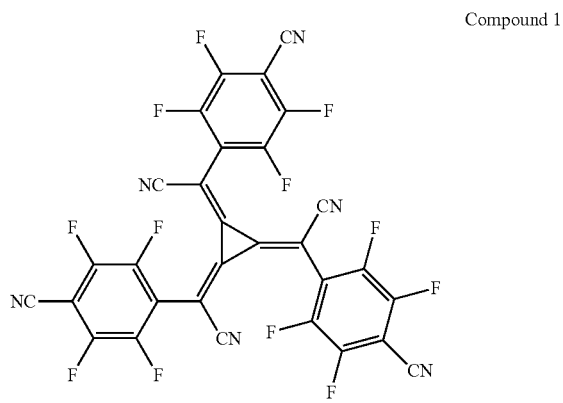

Compound 1

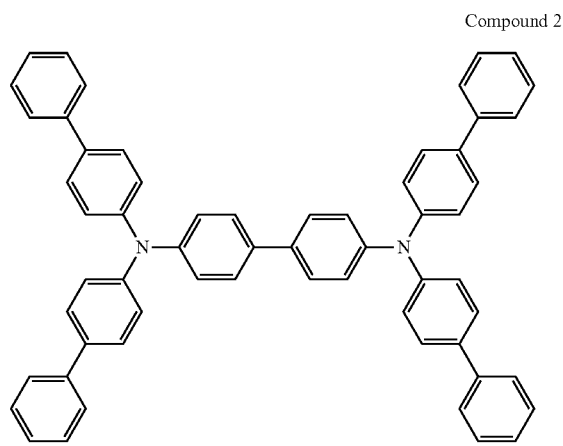

Compound 2

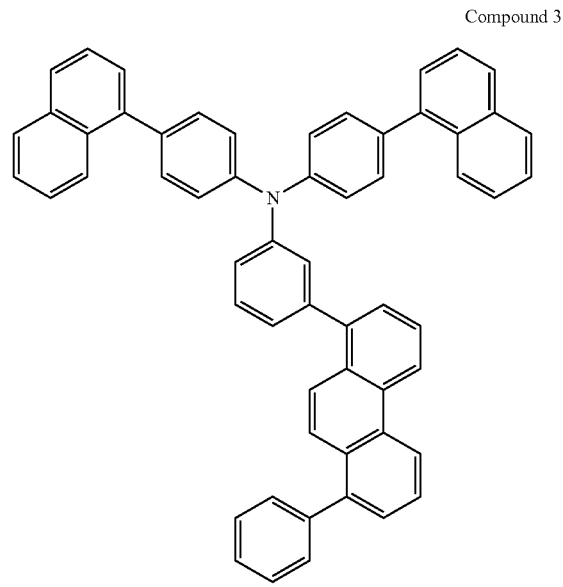

Compound 3

Compound 4

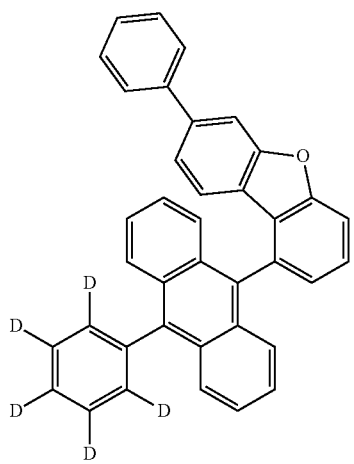

Compound 5

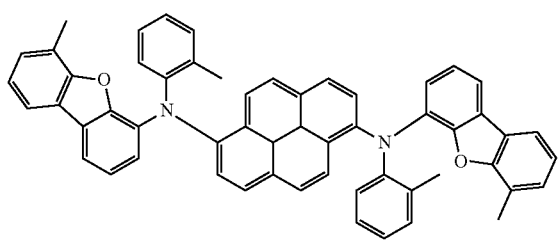

Compound 6

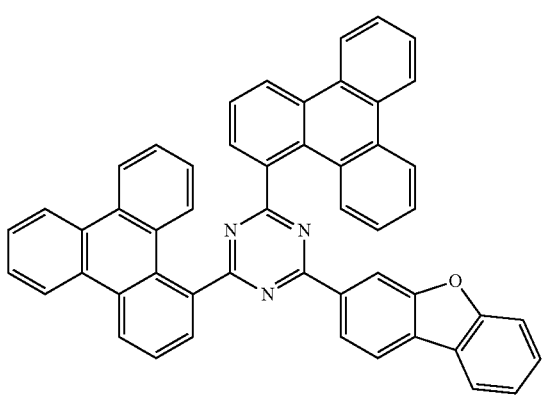

Compound 7

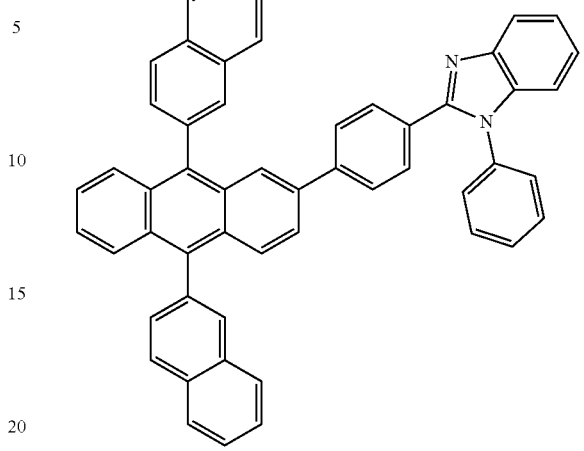

Compound 8

Li—O—(8-hydroxyquinoline)

Application Examples 2-16 and Comparative Application Examples 1-2 differ from Application Example 1 only in that Compound P4 in step (9) was replaced with Compounds P9, P80, P99, P109, P14, P61, P66, P67, P87, P101, P102, P103, P120, P122, P123, C1 and C2 respectively for preparing the capping layer. All the other preparation methods are the same. For details, see Table 3.

Performance Test II Characterization of Device Performance

A performance test was performed on organic electroluminescent devices provided in Application Examples 2-16 and Comparative Application Examples 1-2 as follows.

Currents were measured with Keithley 2365A digital nanovoltmeter at different voltages for the organic electroluminescent devices and then divided by a light-emitting area so that the current densities of the organic optoelectronic devices at different voltages were obtained. The brightness and radiation energy flux density of the organic electroluminescent devices manufactured according to application examples and comparative application examples at different voltages were tested with Konicaminolta CS-2000 spectrometer. According to the current densities and brightness of the organic electroluminescent devices at different voltages, an operating voltage $V_{on}$ (V), a current efficiency CE (cd/A), an external quantum efficiency $EQE_{(max)}$, a color cast JNCD (30/45/60° C.) and a lifetime LT95 (which is obtained by measuring time taken for the organic electroluminescent device to reach 95% of initial brightness (under a condition of 50 mA/cm$^2$)) at the same current density (10 mA/cm$^2$) were obtained. The results are shown in Table 3.

TABLE 3

| No. | Compound | $V_{on}$ (V) | $CE_{(10\ mA/cm^2)}$ (cd A$^{-1}$) | JNCD | $EQE_{(max)}$ (%) | Lifetime LT95 (h) |
|---|---|---|---|---|---|---|
| Application Example 1 | P4 | 3.62 | 6.99 | 2/3/1 | 15.5 | 69 |
| Application Example 2 | P8 | 3.60 | 7.82 | 4/3/1 | 16.3 | 74 |

TABLE 3-continued

| No. | Compound | $V_{on}$ (V) | $CE_{(10\ mA/cm^2)}$ (cd A$^{-1}$) | JNCD | $EQE_{(max)}$ (%) | Lifetime LT95 (h) |
|---|---|---|---|---|---|---|
| Application Example 3 | P80 | 3.61 | 7.89 | 4/1/1 | 17.1 | 81 |
| Application Example 4 | P99 | 3.56 | 7.90 | 4/2/1 | 17.2 | 69 |
| Application Example 5 | P109 | 3.57 | 7.95 | 4/3/1 | 17.5 | 70 |
| Application Example 6 | P14 | 3.63 | 6.99 | 3/3/1 | 16.1 | 71 |
| Application Example 7 | P61 | 3.61 | 7.01 | 3/3/2 | 15.3 | 67 |
| Application Example 8 | P66 | 3.59 | 6.89 | 4/1/1 | 16.0 | 72 |
| Application Example 9 | P67 | 3.78 | 7.03 | 4/2/1 | 15.6 | 69 |
| Application Example 10 | P87 | 3.75 | 7.76 | 4/3/2 | 17.1 | 89 |
| Application Example 11 | P101 | 3.59 | 7.71 | 5/3/1 | 16.0 | 76 |
| Application Example 12 | P102 | 3.56 | 7.70 | 4/1/1 | 16.2 | 68 |
| Application Example 13 | P103 | 3.71 | 7.10 | 4/2/1 | 15.2 | 73 |
| Application Example 14 | P120 | 3.56 | 7.85 | 5/2/2 | 17.1 | 67 |
| Application Example 15 | P122 | 3.59 | 7.12 | 2/3/1 | 15.0 | 66 |
| Application Example 16 | P123 | 3.55 | 6.88 | 4/3/1 | 15.4 | 71 |
| Comparative Application Example 1 | C1 | 3.89 | 6.65 | 6/4/3 | 14.1 | 31 |
| Comparative Application Example 2 | C2 | 3.86 | 5.84 | 5/5/4 | 12.0 | 59 |

It can be seen from Table 5 that when used as a material in the capping layer of the organic electroluminescent device, the compound of the present disclosure can effectively reduce the color cast of the device and improve the current efficiency and the external quantum efficiency.

Application Example 17

This application example provides an organic electroluminescent device which has a structure shown in FIG. 2 and is prepared through specific steps described below.

(1) A glass substrate with an indium tin oxide (ITO) anode layer 2 (with a thickness of 15 nm) was cut into a size of 50 mm×50 mm×0.7 mm, sonicated in isopropyl alcohol and deionized water for 30 min separately, and cleaned under ozone for 10 min. The cleaned substrate 1 was installed onto a vacuum deposition device.

(2) A material for a hole injection layer, Compound 2, and a p-doping material, Compound 1, were co-deposited at a doping ratio of 3% (mass ratio) by means of vacuum evaporation on the ITO anode layer 2 as a hole injection layer 3 with a thickness of 5 nm.

(3) A material for a hole transport layer, Compound 2, was deposited by means of vacuum evaporation on the hole injection layer 3 as a first hole transport layer 4 with a thickness of 100 nm.

(4) A hole transport material, Compound 3, was deposited by means of vacuum evaporation on the first hole transport layer 4 as a second hole transport layer 5 with a thickness of 5 nm.

(5) A light-emitting layer 6 with a thickness of 30 nm was deposited by means of vacuum evaporation on the second hole transport layer 5, where Compound 4 was doped as a host material with Compound 5 as a doping material at a ratio of 3% (mass ratio).

(6) An electron transport material, Compound 6, was deposited by means of vacuum evaporation on the light-emitting layer 6 as a first electron transport layer 7 with a thickness of 30 nm.

(7) An electron transport material, Compound 7, and an n-doping material, Compound 8, were co-deposited at a doping mass ratio of 1:1 by means of vacuum evaporation on the first electron transport layer 7 as a second electron transport layer 8 with a thickness of 5 nm.

(8) A magnesium-silver electrode was deposited at a ratio of 9:1 by means of vacuum evaporation on the second electron transport layer 8 as a cathode 9 with a thickness of 10 nm.

(9) Compound P4 of the present disclosure was deposited by means of vacuum evaporation on the cathode 9 as a first capping layer 10 with a thickness of 100 nm.

(10) A small organic molecule D1 with a low refractive index was deposited by means of vacuum evaporation on the first capping layer 10 as a second capping layer 11 with a thickness of 20 nm.

The small organic molecules with low refractive indexes have the following structures:

D1
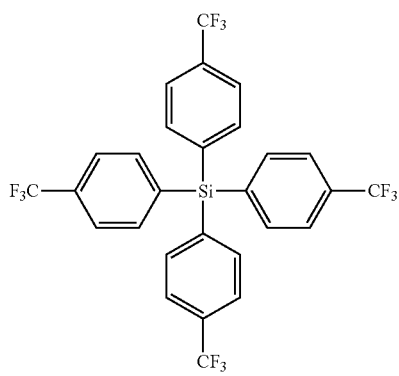
D2
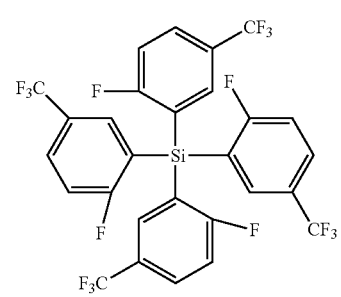
D3
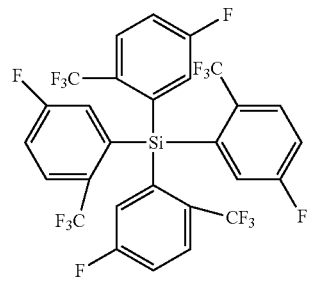
D4
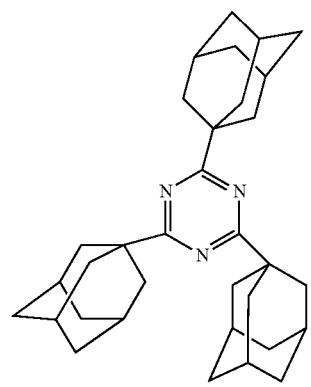
D5
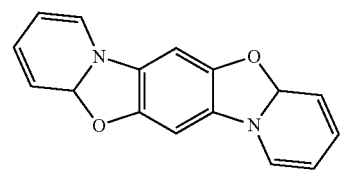
-continued
D6
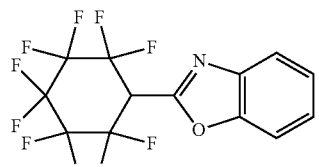
D7
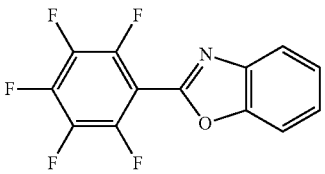
D8
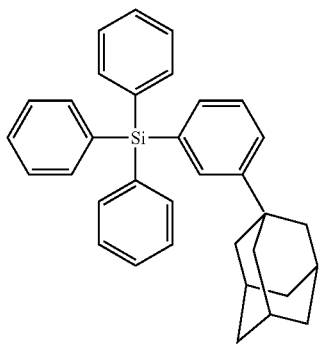
D9
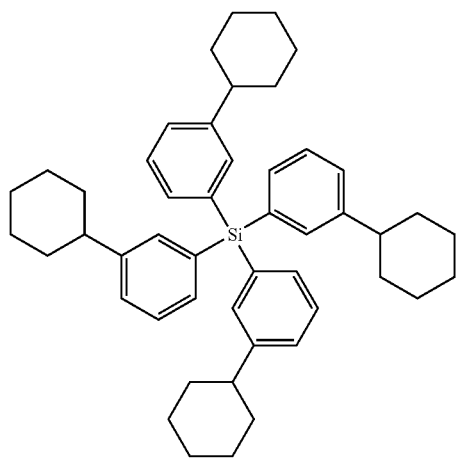
D10
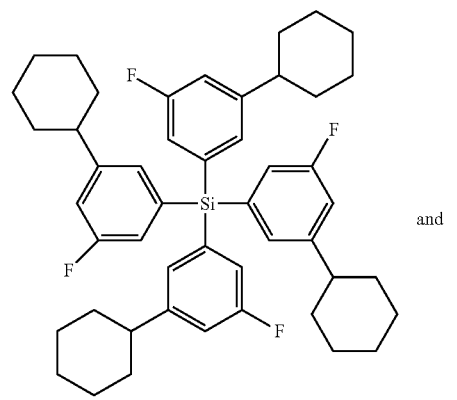
and -continued

D11

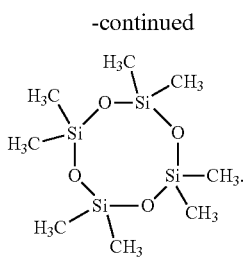

Application Examples 18-27 differ from Application Example 17 only in that the small organic molecule D1 in step (10) was replaced with D2, D3, D4, D5, D6, D7, D8, D9, D10 and D11 respectively for preparing the second capping layer. All the other preparation steps are the same. Application Examples 28-30 and Comparative Application Examples 3-4 differ from Application Example 17 only in that Compound P4 in step (9) was replaced with P80, P99, P109, C1 and C2 respectively for preparing the first capping layer. For details, see Table 4.

The performance test was performed on organic electroluminescent devices provided in Application Examples 17-30 and Comparative Application Examples 3-4 by the same test method described above. The results are shown in Table 4.

TABLE 4

| No. | Material for First Capping Layer | Material for Second Capping Layer | $CE_{(10\ mA/cm^2)}$ (cd A$^{-1}$) | $EQE_{(max)}$ (%) |
|---|---|---|---|---|
| Application Example 17 | P4 | D1 | 7.11 | 16.2 |
| Application Example 18 | P4 | D2 | 7.12 | 16.9 |
| Application Example 19 | P4 | D3 | 7.14 | 17.1 |
| Application Example 20 | P4 | D4 | 7.02 | 15.8 |
| Application Example 21 | P4 | D5 | 7.03 | 15.8 |
| Application Example 22 | P4 | D6 | 7.15 | 17.3 |
| Application Example 23 | P4 | D7 | 7.16 | 17.5 |
| Application Example 24 | P4 | D8 | 7.05 | 15.9 |
| Application Example 25 | P4 | D9 | 7.03 | 15.7 |
| Application Example 26 | P4 | D10 | 7.08 | 15.9 |
| Application Example 27 | P4 | D11 | 7.01 | 15.7 |
| Application Example 28 | P80 | D1 | 8.02 | 18.1 |
| Application Example 29 | P99 | D1 | 8.03 | 18.0 |
| Application Example 30 | P109 | D1 | 8.09 | 18.2 |
| Comparative Application Example 3 | C1 | D1 | 6.78 | 14.3 |
| Comparative Application Example 4 | C2 | D1 | 6.01 | 12.2 |

It can be seen from Table 4 that compared with the use of Compound C1 or C2 with the material containing small organic molecules with a low refractive index used in the second capping layer, the use of the compound provided by the present disclosure as the material in the first capping layer with the material containing small organic molecules with a low refractive index used in the second capping layer is more conducive to improving the efficiency of the device, especially in terms of improving the external quantum efficiency.

The applicant has stated that although the detailed method of the present disclosure is described through the examples described above, the present disclosure is not limited to the detailed method described above, which means that the implementation of the present disclosure does not necessarily depend on the detailed method described above. It should be apparent to those skilled in the art that any improvements made to the present disclosure, equivalent substitutions of various raw materials of the product, the addition of adjuvant ingredients, and the selection of specific manners, etc. in the present disclosure all fall within the protection scope and the disclosure scope of the present disclosure.

What is claimed is:

1. A compound having a structure represented by Formula (1):

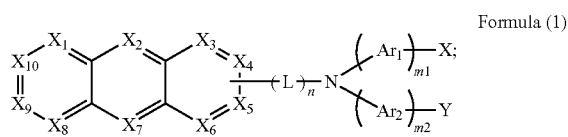

wherein, $X_1$ to $X_{10}$ are each independently selected from the group consisting of N, CH and CRa, wherein Ra is selected from the group consisting of a deuterium atom, $CD_3$, $CD_2CH_3$, $CD_2CD_3$, cyano, substituted or unsubstituted $C_6$-$C_{60}$ aryl, and a combination of at least two selected therefrom;

wherein, n is an integer from 0 to 4, and L is selected from the group consisting of substituted or unsubstituted $C_6$-$C_{60}$ arylene and substituted or unsubstituted $C_3$-$C_{60}$ heteroarylene;

wherein, m1 and m2 are each independently an integer from 0 to 4, and $Ar_1$ and $Ar_2$ are each independently selected from the following substituted or unsubstituted groups: phenylene, biphenylene, terphenylene, tetraphenylene, naphthylene, phenanthrylene, carbazolylene, dibenzofurylene, dibenzothienylene, pyrimidinylene, triazinylene, indolocarbazolylene, indolobenzofurylene, indolobenzothienylene, benzofuropyrimidinylene, benzothienopyrimidinylene, anthrylene and pyrenylene;

wherein, X and Y are each independently selected from substituted or unsubstituted C3-C60 electron withdrawing heteroaryl;

wherein the C3-C60 electron withdrawing heteroaryl is any one selected from the group consisting of the following groups:

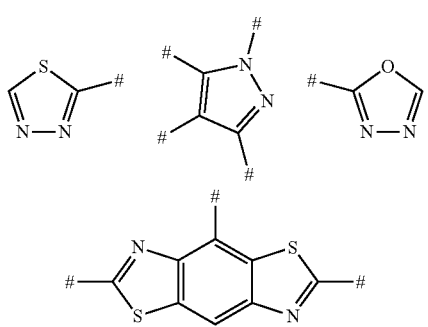

-continued

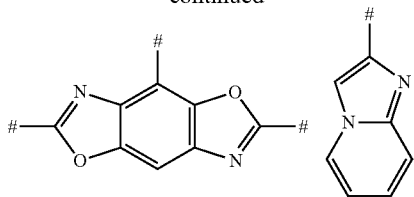

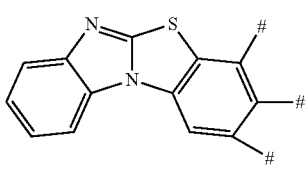

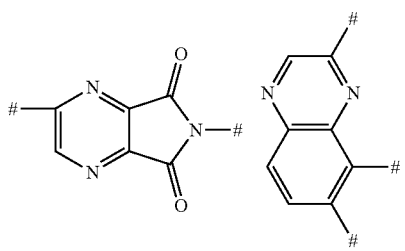

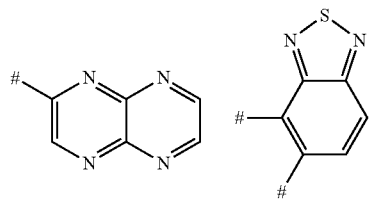

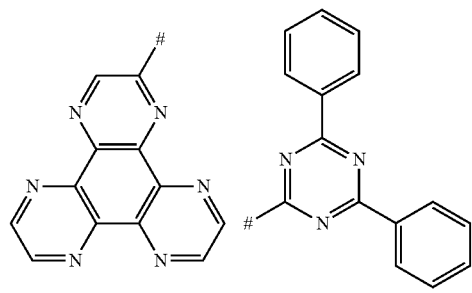

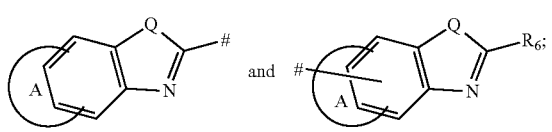

wherein, if the group only has one #, the # represents a linkage site of the group, and wherein if the group has at least two #, a linkage site of the group is selected from any one of the #;

wherein Q is selected from the group consisting of an O atom, a S atom and $NR_8$;

wherein each of $R_6$ to $R_7$ is independently selected from the group consisting of hydrogen, protium, deuterium, tritium, halogen, cyano, C1-C10 alkyl, C1-C10 alkoxy, C6-C60 aryl and C3-C60 heteroaryl; and wherein the ring A is fused at any position of a benzene ring where the ring A is able to be fused and the ring A is selected from the group consisting of substituted or unsubstituted C6-C30 aromatic rings and substituted or unsubstituted C3-C30 heteroaromatic rings; and wherein substituted groups in Ra, L, $Ar_1$, $Ar_2$, X and Y are each independently selected from the group consisting of protium, deuterium, tritium, cyano, halogen, C1-C10 alkyl, C1-C10 haloalkyl, C1-C10 alkoxy, C6-C60 aryl, C3-C60 heteroaryl, and a combination of at least two selected therefrom.

2. The compound according to claim 1, wherein the compound has a structure represented by Formula (2);

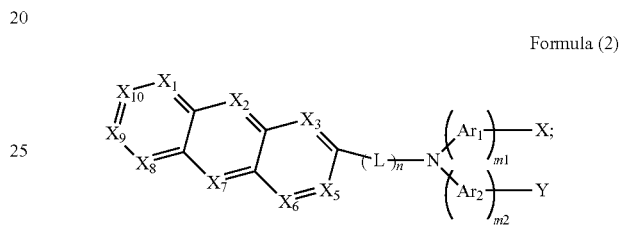

Formula (2)

wherein in Formula (2), $X_1$ to $X_{10}$, n, m1, m2, X and Y each have the same ranges as defined in claim 1.

3. The compound according to claim 1, wherein $X_1$, $X_2$, $X_3$, $X_4$, $X_5$, $X_6$, $X_7$, $X_8$, $X_9$ and $X_{10}$ are each CH.

4. The compound according to claim 1, wherein at least one of $X_1$, $X_2$, $X_3$, $X_4$, $X_5$, $X_6$, $X_7$, $X_8$, $X_9$ and $X_{10}$ is selected from N.

5. The compound according to claim 1, wherein at least one of $X_1$, $X_2$, $X_3$, $X_4$, $X_5$, $X_6$, $X_7$, $X_8$, $X_9$ and $X_{10}$ is selected from CD.

6. The compound according to claim 1, wherein $X_2$ and $X_7$ are each selected from CD.

7. The compound according to claim 1, wherein L is any one selected from the group consisting of the following substituted or unsubstituted groups: phenylene, biphenylene, terphenylene, tetraphenylene, naphthylene, phenanthrylene, fluorenylidene, carbazolylene, dibenzofurylene, dibenzothienylene, pyrimidinylene, triazinylene, indolocarbazolylene, indolobenzofurylene, indolobenzothienylene, benzofuropyrimidinylene, benzothienopyrimidinylene, anthrylene and pyrenylene.

8. The compound according to claim 1, wherein the difference between the refractive index of the compound at a wavelength of 460 nm and the refractive index of the compound at a wavelength of 530 nm is 0.10-0.17, the difference between the refractive index of the compound at a wavelength of 530 nm and the refractive index of the compound at a wavelength of 620 nm is 0.03-0.10, and the difference between the refractive index of the compound at a wavelength of 460 nm and the refractive index of the compound at a wavelength of 620 nm is 0.15-0.40.

9. The compound according to claim 1, wherein the compound has any one of structures represented by P91 to P103 and P118 to P123:

83
P91
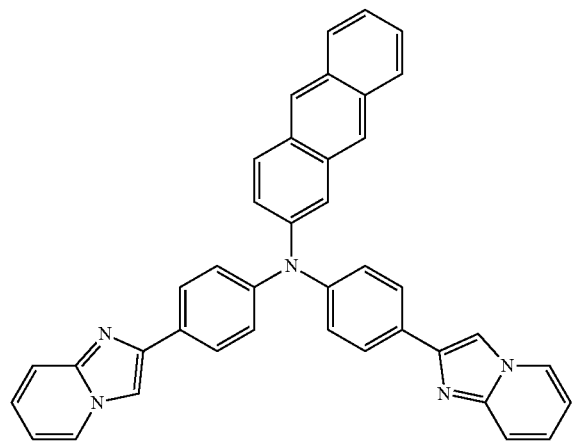
84
P92
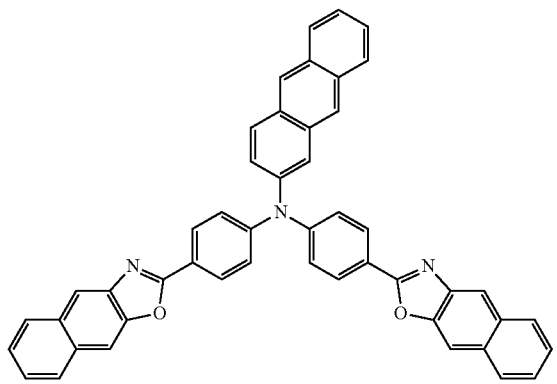
P93
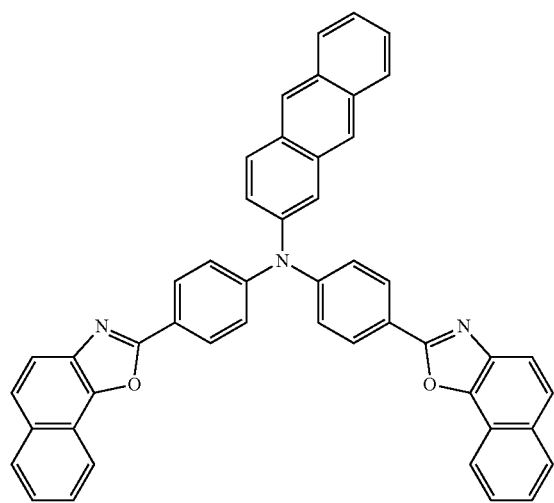
P94
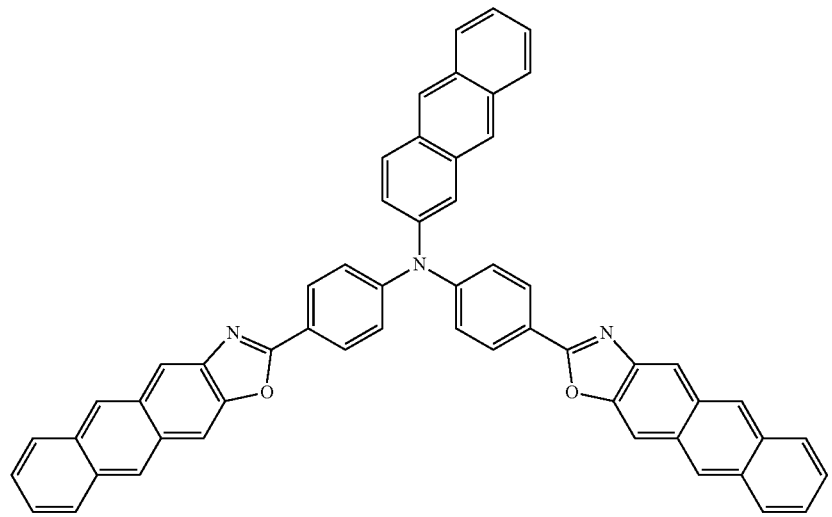

P95
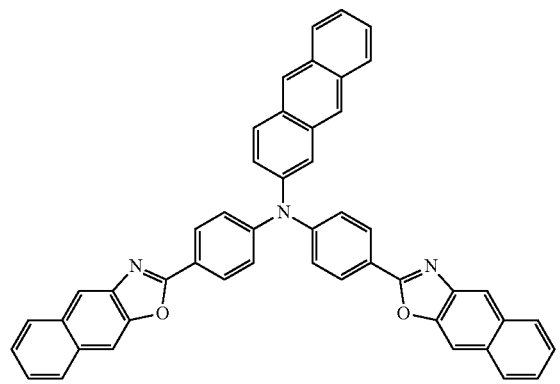
P96
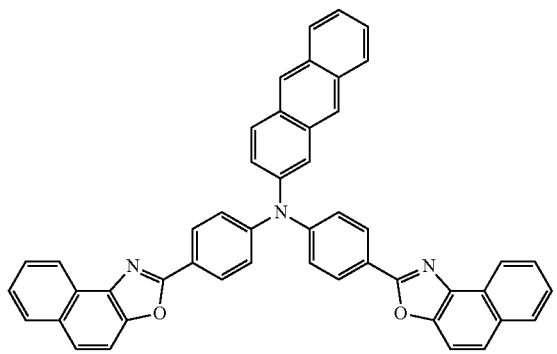
P97
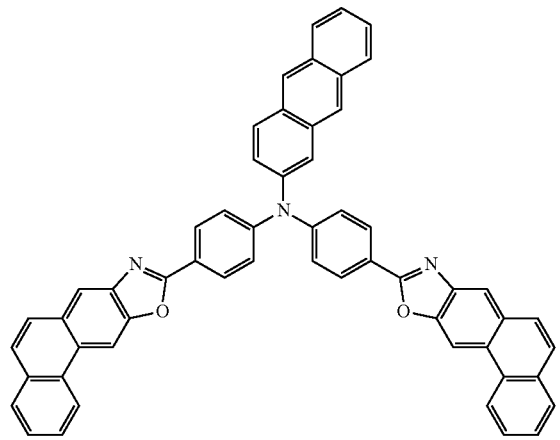
P98
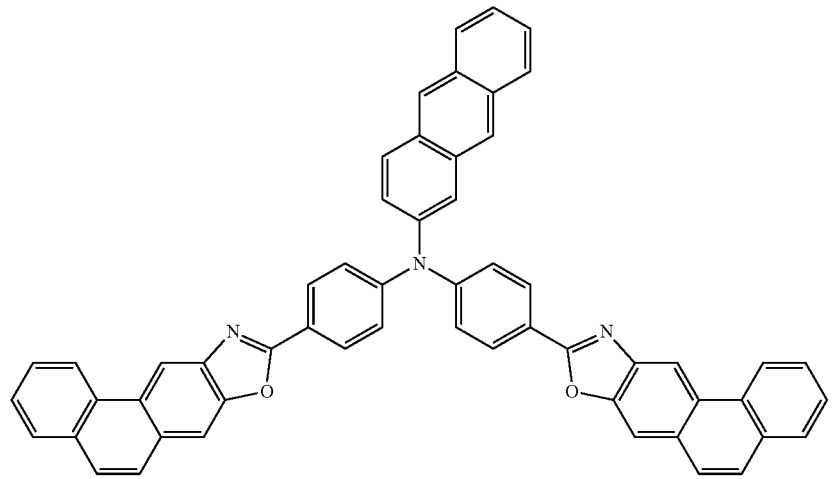

-continued
P99
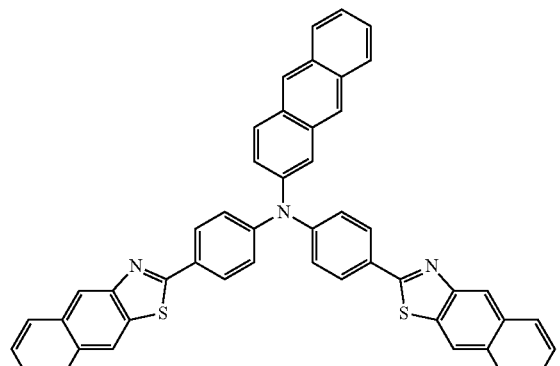
P100
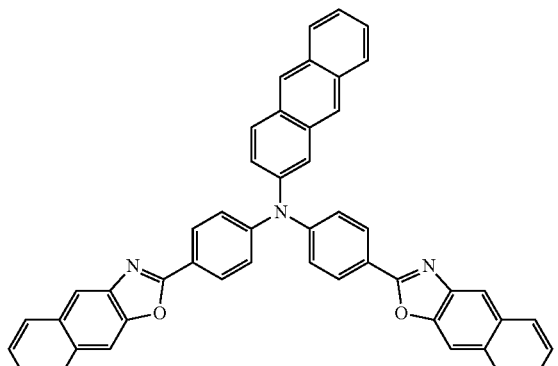
P101
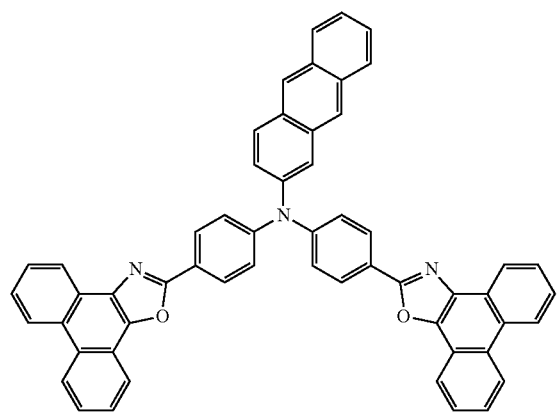
P102
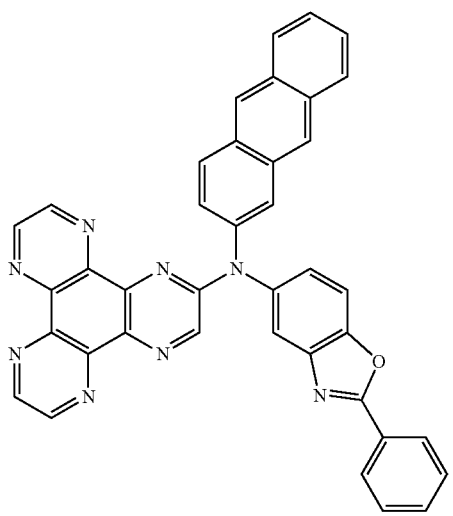
P103
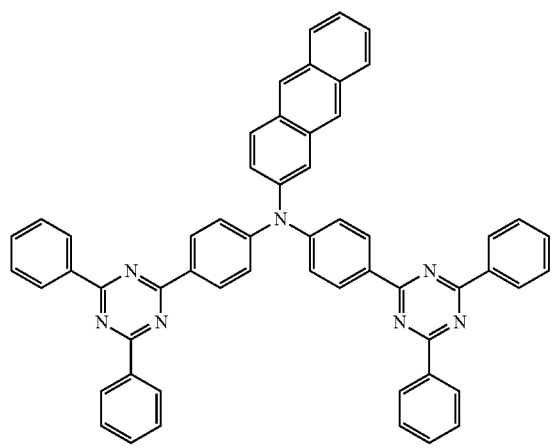
P118
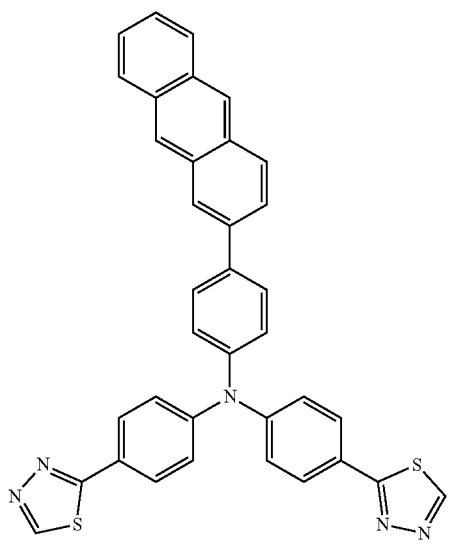

-continued
P119
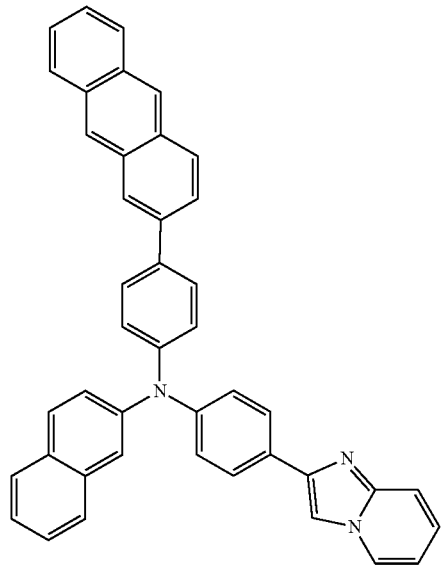
P120
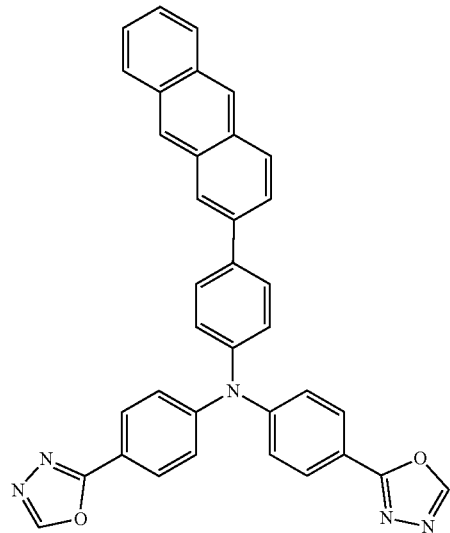
P121
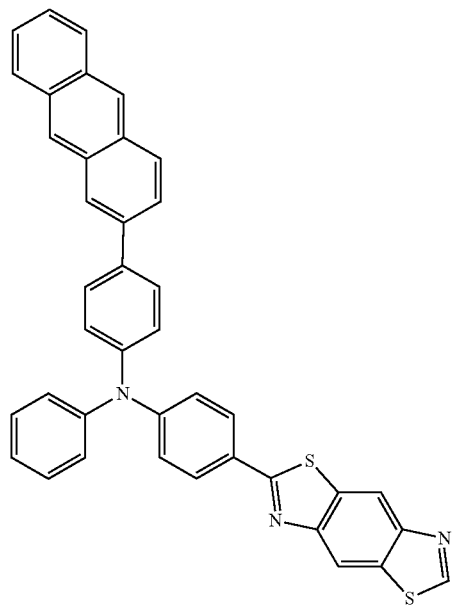
P122
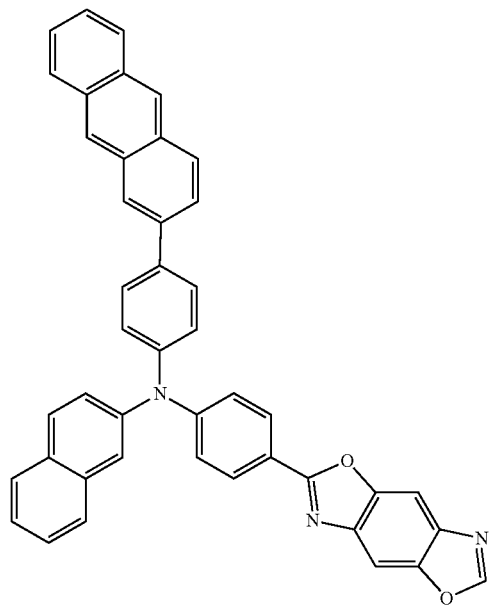
and

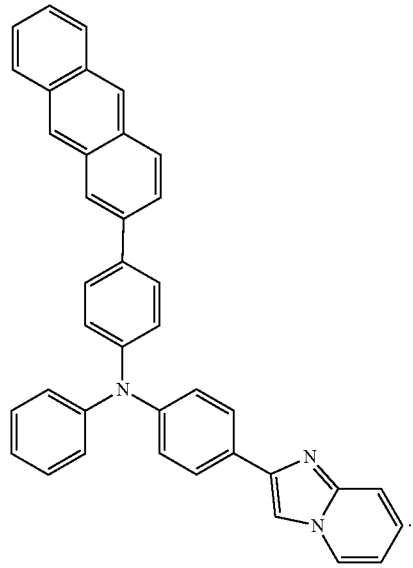
P123

10. A material for an organic electroluminescent device, comprising any one or a combination of at least two of the compound according to claim 1.

11. An organic electroluminescent element, comprising a first electrode layer, an organic function layer and a second electrode layer which are stacked in sequence;
wherein the organic function layer comprises the material according to claim 10.

12. An organic electroluminescent element, comprising a first capping layer, a first electrode layer, an organic function layer and a second electrode layer which are stacked in sequence;
wherein the first capping layer comprises the material according to claim 10.

13. The organic electroluminescent element according to claim 12, further comprising a second capping layer disposed on a side of the first capping layer facing away from the first electrode layer, wherein the second capping layer comprises lithium fluoride and/or a material containing small organic molecules with a refractive index of 1.40-1.65.

14. A display panel, comprising the organic electroluminescent element according to claim 11, wherein the display panel is optionally used in a display device.

15. A display panel, comprising the organic electroluminescent element according to claim 12, wherein the display panel is optionally used in a display device.

* * * * *